US 9,348,964 B2

(12) United States Patent
Zhang et al.

(10) Patent No.: US 9,348,964 B2
(45) Date of Patent: May 24, 2016

(54) MASK3D MODEL ACCURACY ENHANCEMENT FOR SMALL FEATURE COUPLING EFFECT

(71) Applicant: Synopsys, Inc., Mountain View, CA (US)

(72) Inventors: Hongbo Zhang, Beaverton, OR (US); Qiliang Yan, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 12 days.

(21) Appl. No.: 14/257,798

(22) Filed: Apr. 21, 2014

(65) Prior Publication Data

US 2015/0302132 A1 Oct. 22, 2015

(51) Int. Cl.
*G06F 17/50* (2006.01)

(52) U.S. Cl.
CPC ........ *G06F 17/5081* (2013.01); *G06F 17/5009* (2013.01)

(58) Field of Classification Search
CPC .......................... G06F 17/5081; G06F 17/5009
USPC ........................................................... 716/53
See application file for complete search history.

(56) References Cited

U.S. PATENT DOCUMENTS

| 7,703,069 | B1 | 4/2010 | Liu et al. |
| 7,818,710 | B2 | 10/2010 | Wang et al. |
| 7,921,383 | B1 | 4/2011 | Wei |
| 8,136,054 | B2 | 3/2012 | Chen et al. |
| 8,271,910 | B2 * | 9/2012 | Tirapu-Azpiroz et al. ..... 716/54 |
| 8,352,885 | B2 | 1/2013 | Liu et al. |
| 8,918,743 | B1 | 12/2014 | Yan et al. |
| 2006/0209314 | A1 | 9/2006 | Latypov et al. |
| 2007/0245292 | A1 | 10/2007 | Satake et al. |
| 2008/0204690 | A1 | 8/2008 | Berger et al. |
| 2010/0162199 | A1 | 6/2010 | Liu et al. |
| 2010/0175042 | A1 | 7/2010 | Azpiroz et al. |
| 2013/0139118 | A1 | 5/2013 | Liu et al. |

OTHER PUBLICATIONS

Huang, Hsu-Ting, et al, "Full-chip OPC and verification with a fast mask 3D model," Proc. of SPIE vol. 7973, Mar. 22, 2011, 9 pages.
Liu, Peng, "Accurate prediction of 3D mask topography induced best focus variation in full-chip photolithography applications," Proc. of SPIE vol. 8166, Oct. 13, 2011, 8 pages.
Liu, Peng, et al, "A full-chip 3D computational lithography framework," Proc. of SPIE vol. 8326, Feb. 21, 2012, 18 pages.

* cited by examiner

*Primary Examiner* — Jack Chiang
*Assistant Examiner* — Brandon Bowers
(74) *Attorney, Agent, or Firm* — HIPLegal LLP; Judith A. Szepesi

(57) ABSTRACT

A method and apparatus of a novel full chip edge-based mask three-dimensional (3D) model for performing photolithography simulation with consideration for edge coupling effect is described. The method receives a mask design layout in order to perform mask topography effect modeling. The method generates scaling parameters for edge coupling effects. Each scaling parameter has an associated combination of feature width and space. The sum of feature width and space associated with at least one scaling parameter is less than a minimum pitch. The method applies a thick mask model that includes several edge-based kernels to the mask design layout to create a mask 3D residual. To apply the thick mask model to the mask design layout, the method updates the edge-based kernels with the scaling parameters.

20 Claims, 19 Drawing Sheets

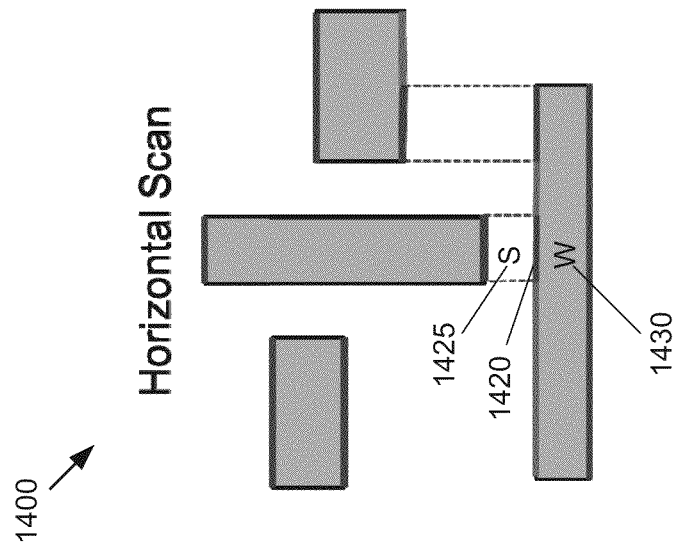
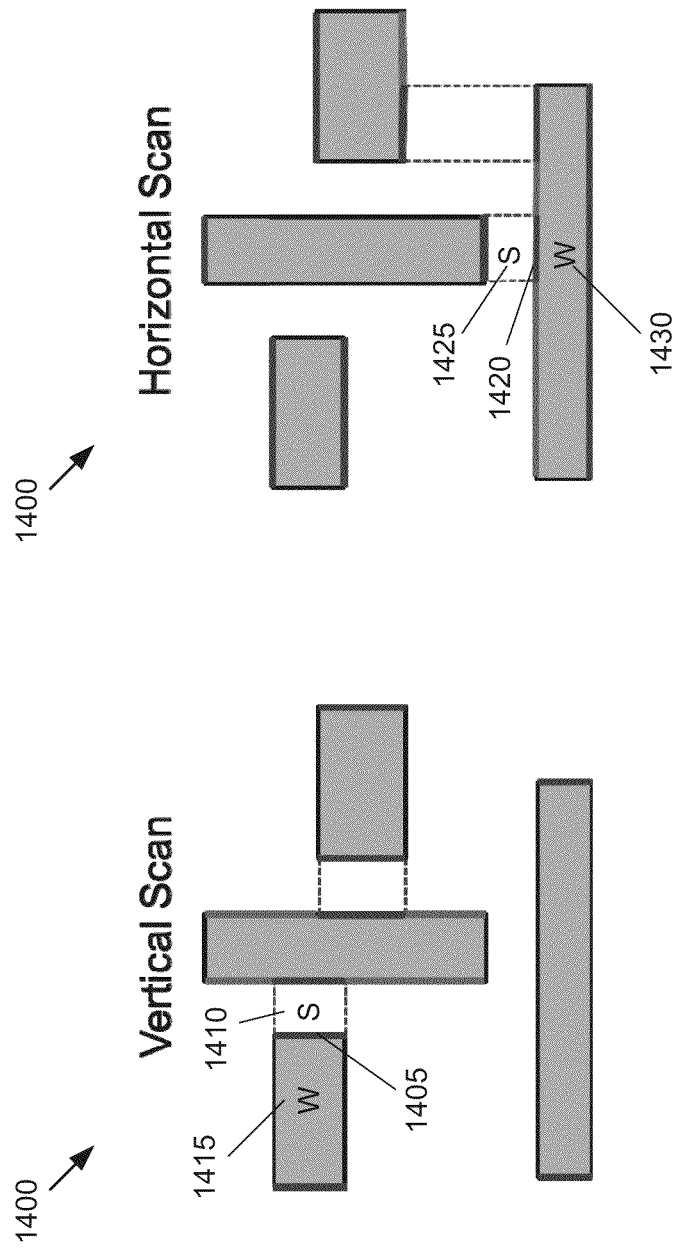
FIG. 14B
FIG. 14A

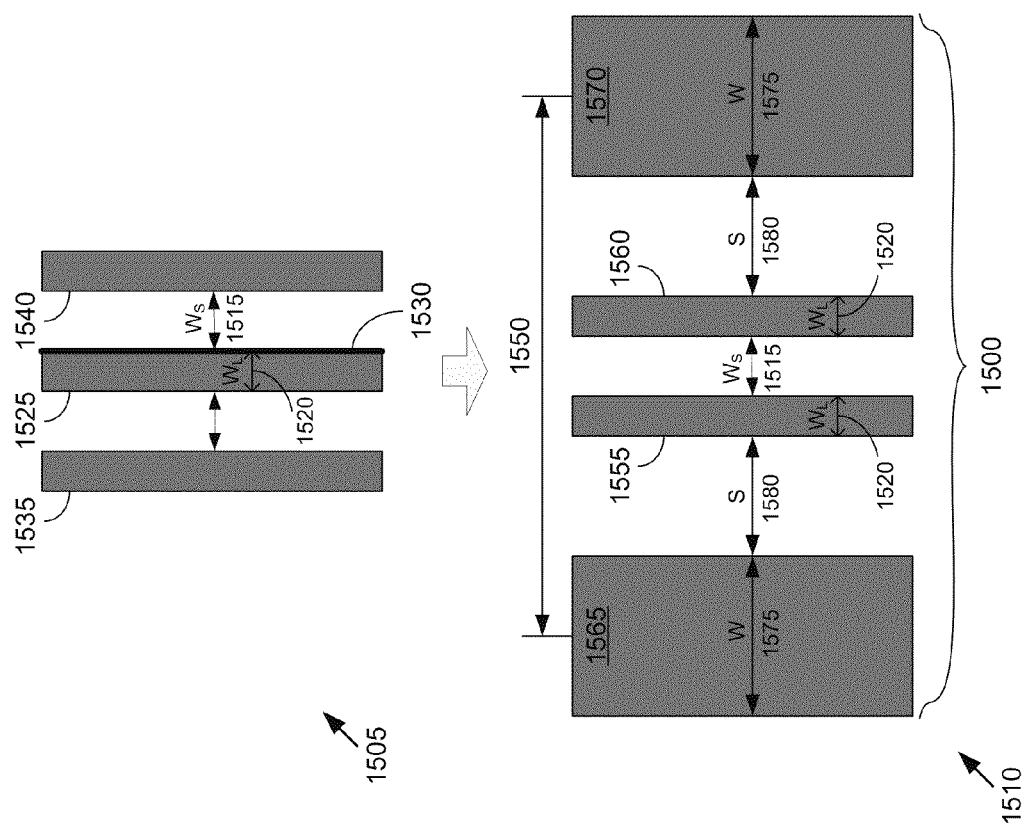

MASK3D MODEL ACCURACY ENHANCEMENT FOR SMALL FEATURE COUPLING EFFECT

FIELD

The present invention relates to electronic design automation and in particular to simulating photolithography processes.

BACKGROUND

Photolithography is a process used in microfabrication to pattern the bulk of a substrate. It uses light to transfer a geometric pattern from an optical mask to a light-sensitive chemical "photoresist", or simply "resist," on the substrate. The pattern in the resist is created by exposing it to light with a projected image using an optical mask.

Optical proximity correction (OPC) is a photolithography enhancement technique commonly used to compensate for image errors due to diffraction or process effects. OPC corrects image errors by moving edges or adding extra polygons to the pattern written on the optical mask. Model based OPC uses compact models to dynamically simulate the final pattern and thereby derive the movement of edges, typically broken into sections, to find the best solution. The objective is to reproduce, as well as possible, the original layout drawn by the designer in the silicon wafer.

The cost of manufacturing advanced mask sets is steadily increasing as technology becomes more and more complex. In addition, the turn-around time is always an important consideration in semiconductor manufacturing. As a result, computer simulations of the photolithography process, which assist in reducing both the cost and turn-around time, have become an integral part of semiconductor manufacturing.

One of the most important inputs to any photolithography simulation system is the model for the interaction between the illuminating electric field and the mask. Conventionally, the thin mask approximation is used in most photolithography simulation systems. The thin mask approximation, also called the Kirchhoff boundary condition or mask two-dimensional (2D), assumes that the thickness of the structures on the mask is very small compared with the wavelength and that the widths of the structures on the mask are very large compared with the wavelength. Therefore, the thin mask model provides reasonably accurate calculations for feature sizes much larger than the exposure wavelength.

As semiconductor feature sizes continue to shrink further below the exposure wavelength, mask topography effect, also called thick mask effect or mask three-dimensional (3D), is a considerable factor to impact the photolithography modeling and full chip OPC process. The mask topography effect includes polarization dependence due to the different boundary conditions for the electric and magnetic fields, transmission and phase error in small openings, edge diffraction (or scattering) effects or electromagnetic coupling.

The thin mask approximation is not accurate enough in simulating mask topography effect. FIG. 1A illustrates a mask image simulated by using thin mask model. Specifically, this figure shows light 110 passes through an optical mask 105. The resulting mask image, as simulated by the thin mask model, is pattern 115.

In optical reflection, the plane of incidence is the plane spanned by the surface normal and the propagation vector of the incoming radiation. The component of the electric field parallel to the plane of incidence is termed p-like (parallel) and the component perpendicular to the plane of incidence is termed s-like. Light with a p-like electric field is said to be a transverse-magnetic (TM) wave. Light with an s-like electric field is called a transverse-electric (TE) wave.

FIG. 1B illustrates mask images rigorously simulated by using thick mask model that takes mask topography effect into consideration. Specifically, this figure shows light is decomposed into TE wave 120 and TM wave 125. The TE wave 120 and TM wave 125 pass through the optical mask 105. The resulting mask images, as rigorously simulated by the thick mask model, are patterns 130 and 135, respectively. As illustrated in FIG. 1B, both the patterns 130 and 135 have wave perturbations 150 and 155 respectively, due to the mask topography effect. The wave perturbations 150 and 155 cannot be accurately simulated by using the thin mask model described in FIG. 1A above.

Among different types of modeling schemes for tackling mask topography effect, rigorous simulation is usually considered to be accurate. But rigorous simulation runs extremely slowly, making it impractical for full chip level implementation. Instead, application of rigorous simulation is limited to small areas of a chip design layout. The prior art of the compact modeling schemes with domain decomposition and boundary layer definition lack real physical meaning and rely on intensive model fitting. Consequently, conventional compact modeling schemes cannot accurately simulate the mask topography effect.

Edge coupling effect is the mask near-field interaction among adjacent edges. In photolithography simulation, strong edge coupling effect will be generated when feature size and space are small. Prior art photolithography simulation schemes do not address edge coupling effect with both accuracy and runtime efficiency.

BRIEF DESCRIPTION OF THE FIGURES

The present invention is illustrated by way of example, and not by way of limitation, in the figures of the accompanying drawings and in which like reference numerals refer to similar elements and in which:

FIG. 14A illustrates using vertical scan to determine vertical edge segments and adjacent feature width and space.

FIG. 14B illustrates using horizontal scan to determine horizontal edge segments and adjacent feature width and space.

FIG. 15 illustrates an example of one embodiment for generating near-field reference for edge coupling effect on small features.

DETAILED DESCRIPTION

Figure 1A:
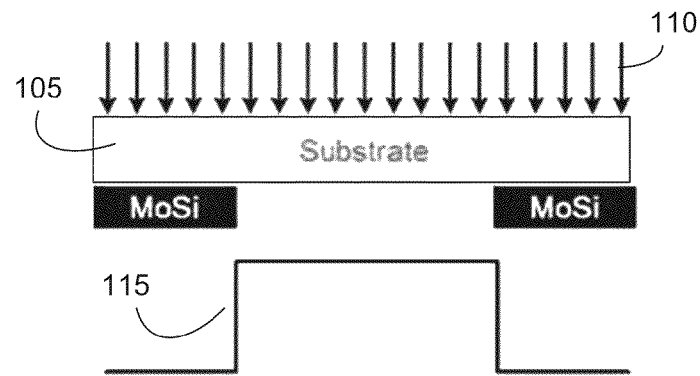
FIG. 1A illustrates a mask image simulated by using thin mask model.
Figure 1B:
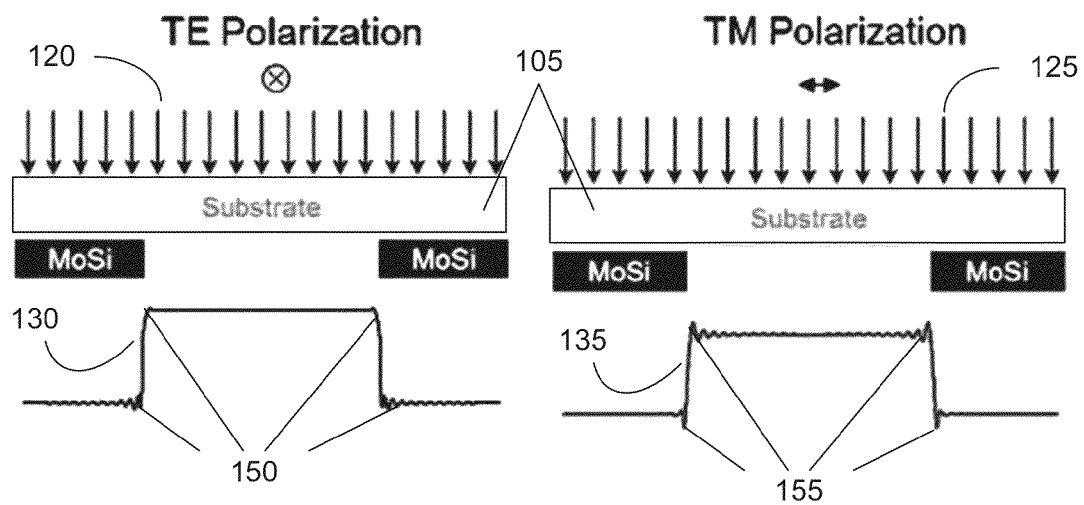
FIG. 1B illustrates mask images rigorously simulated by using thick mask model that takes mask topography effect into consideration.

A full chip edge-based mask 3D model for performing photolithography simulation with consideration for edge coupling effect is described. The edge-based mask 3D model relies on the real physical mask 3D behavior decomposition based on empirical data or rigorous modeling simulation. Instead of straightforward kernel fitting with empirical data as in the prior art, the full chip edge-based mask 3D model adopts a modeling process from rigorous simulation to decompose the real physical response into edge-based modeling components. Thus, a compact model can be achieved for full chip simulation and optical proximity correction (OPC) process. The understanding of the true physical behavior of the mask 3D has strong prediction power and high runtime efficiency for various types of one-dimensional and 2D patterns.

In an exemplary embodiment, a method and apparatus receives a mask design layout in order to perform mask topography effect modeling. The method generates scaling parameters for edge coupling effects. Each scaling parameter has an associated combination of feature width and space. For a particular layer of the IC fabrication process, the pitch specifies the periodical structure's periodical length. For 1D type pattern, the pitch is a sum of the width of the feature and the space on one side of the feature separating that feature from a neighboring feature on the same layer. In a single exposure process, the minimum pitch represents the smallest pitch that is allowed to have the periodical structure printed. In one embodiment, the sum of feature width and space associated with at least one scaling parameter is less than a minimum pitch. The method applies a thick mask model that includes several edge-based kernels to the mask design layout to create a mask 3D residual.

To apply the thick mask model to the mask design layout, in one embodiment, the method updates the edge-based kernels with the scaling parameters. The method applies a rasterization filter to the edge-based kernels to generate several filtered kernels. The method applies the filtered kernels to edges in the mask design layout to create the 3D mask residual.

In one embodiment, to generate the scaling parameters, the method collects near-field data for a first plurality of periodic structures through rigorous simulation. Each of the first plurality of periodic structures is associated with a combination of feature width and space. In one embodiment, the sum of the feature width and the space associated with each of the first plurality of periodic structures is greater than or equal to the minimum pitch. For each of the first plurality of periodic structures, the method calculates a set of first scaling parameters in on embodiment by performing linear regression based on the plurality of filtered kernels and the near-field data related to the periodic structure. In one embodiment, the method stores the calculated first scaling parameters into a lookup table. Each first scaling parameter in the lookup table is indexed by a combination of feature width and space of a corresponding periodic structure.

The method collects reference near-field data for a second plurality of periodic structures through rigorous simulation. In one embodiment, each of the second plurality of periodic structures includes a first set of components whose sum of feature width and space is less than the minimum pitch and a second set of components whose sum of feature width and space is greater than or equal to the minimum pitch. The method extracts near-field data for the first set of components by subtracting near-field data for the second set of components from the reference near-field data. In one embodiment, for each of the second plurality of periodic structures, the method calculates a set of second scaling parameters by performing linear regression based on the plurality of filtered kernels and the near-field data for the first set of components of the periodic structure. The method stores the calculated second scaling parameters in the lookup table. Each second scaling parameter stored in the lookup table is indexed by a combination of feature width and space of the first set of components of a corresponding periodic structure.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

Figure 2:
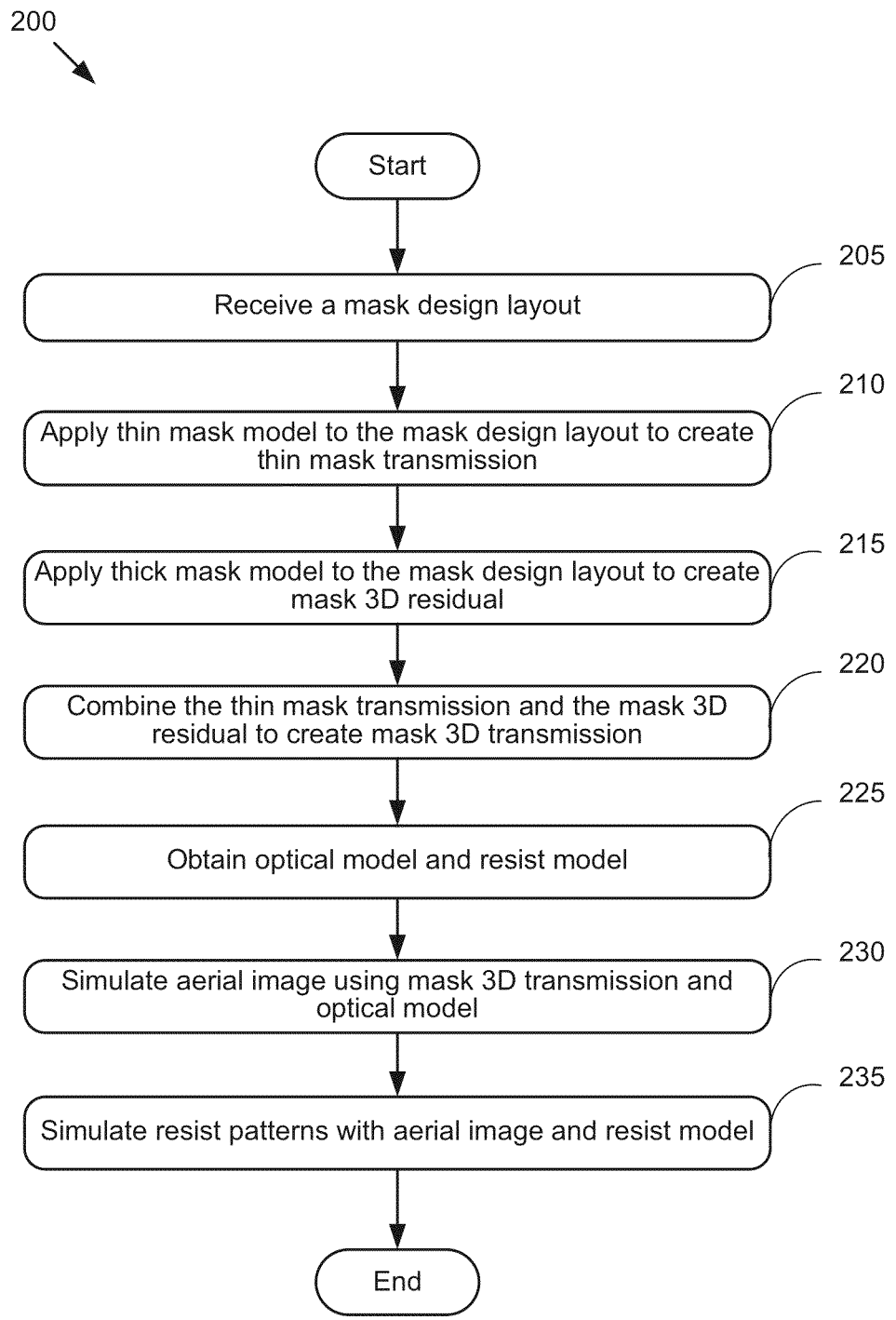
FIG. 2 is an overview flowchart of one embodiment of using edge-based mask 3D model to perform photolithography simulation.

FIG. 2 is an overview flowchart of one embodiment of using edge-based mask 3D model to perform photolithography simulation. Specifically, this figure describes a process 200 that performs photolithography simulation by using the combination of a thin mask transmission and a mask 3D residual to form a mask 3D transmission. In one embodiment, the process 200 starts when a design layout of an optical mask needs to be verified to see if it can produce the desired wafer pattern. As shown in the figure, the process 200 begins by receiving, at block 205, a mask design layout. In one embodiment, the mask design layout is in the form of a polygon-based hierarchical data file in the GDS (Graphic Database System) or OASIS.MASK format.

At block 210, the process 200 applies thin mask model to the mask design layout to create a thin mask transmission. The process 200, at block 215, applies thick mask model to the mask design layout to create a mask 3D residual. The thick mask model and the creation of the mask 3D residual will be further described in FIGS. 3-9.

The process 200, at block 220, combines the thin mask transmission and the mask 3D residual to create a mask 3D transmission. At block 225, the process 200 obtains an optical model and a resist model.

The optical model simulates the projection and image forming process in the exposure tool. The optical model incorporates critical parameters of the illumination and projection system. In one embodiment, these parameters of the illumination and project system include numerical aperture and partial coherence settings, illumination wavelength, illuminator source shape, and possibly imperfections of the system such as aberrations or flare.

The resist model helps to predict shapes and sizes of structures formed on a substrate. In one embodiment, the resist model is used to simulate the effect of projected light interacting with the photosensitive resist layer and the subsequent post-exposure bake (PEB) and development process.

Next, the process 200 simulates, at block 230, aerial image using the mask 3D transmission and the optical model. At block 235, the process 200 simulates resist patterns on the wafer with the simulated aerial image and the resist model. The process 200 then ends.

One of ordinary skill in the art will recognize that the process 200 is a conceptual representation of the operations used to perform photolithography simulation. The specific operations of the process 200 may not be performed in the exact order shown and described. For example, blocks 210 and 215 are not dependent on each other, and therefore can be performed in reverse order or in parallel. The specific operations may not be performed in one continuous series of operations, and different specific operations may be performed in different embodiments. Furthermore, the process could be implemented using several sub-processes, or as part of a larger macro process. For instance, in some embodiments, the process 200 is performed by one or more software applications that execute on one or more computers.

Figure 3:
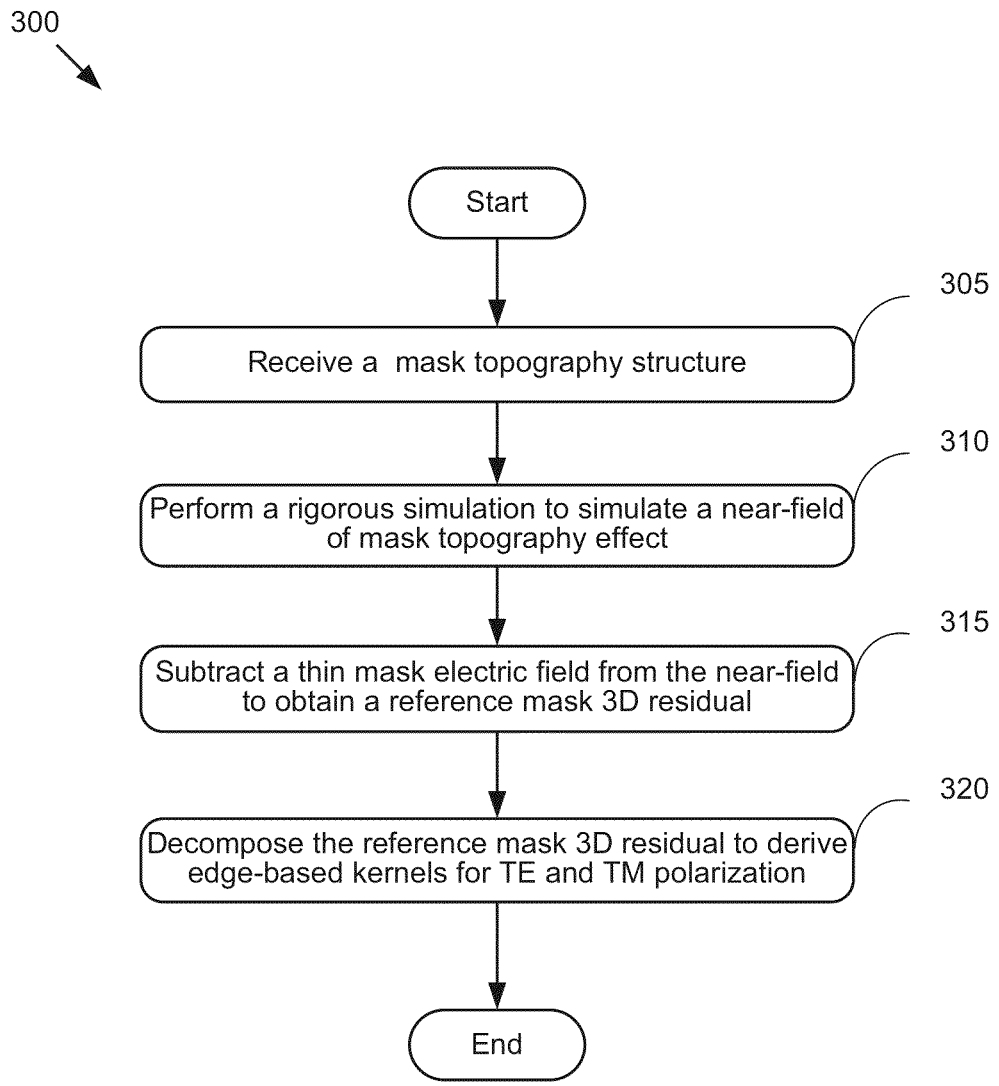
FIG. 3 is a flowchart of one embodiment of generating the thick mask model.

FIG. 3 is a flowchart of one embodiment of generating the thick mask model. Specifically, this figure describes a process 300 that generates edge-based kernels of the thick mask model. A kernel is a function that can be applied to an image through convolution in order to generate certain effects. Edge-based kernels are kernels that are extracted based on the physical attributes of edges. In one embodiment, the process 300 starts when a thick mask model is needed to accurately simulate the mask topography effect. For example, the process 300 is performed before the execution of block 215 described in FIG. 2 above. As shown in the figure, the process 300 begins by receiving, at block 305, a mask topography structure. The mask topography structure is the physical 3D structure of the real mask that could distort the near-field image of mask from the ideal thin mask model. In one embodiment, the mask topography structure is a combination of all the factors, including material, geometry setting and process variations, in mask making and implementations.

At block 310, the process 300 performs a rigorous simulation to simulate a near-field of the mask topography effect. At block 315, the process 300 subtracts a thin mask electric field from the near-field to obtain a reference mask 3D residual. In one embodiment, the thin mask electric field can be gained with a rasterization with foreground and background transmission.

The process 300, at block 320, decomposes the reference mask 3D residual to derive edge-based kernels for TE polarization and TM polarization. The reference mask 3D residual and the edge-based kernels will be further described in FIG. 5 below. The process 300 then ends.

One of ordinary skill in the art will recognize that the process 300 is a conceptual representation of the operations used to generate the thick mask model. The specific operations of the process 300 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 300 is performed by one or more software applications that execute on one or more computers.

Figure 4:
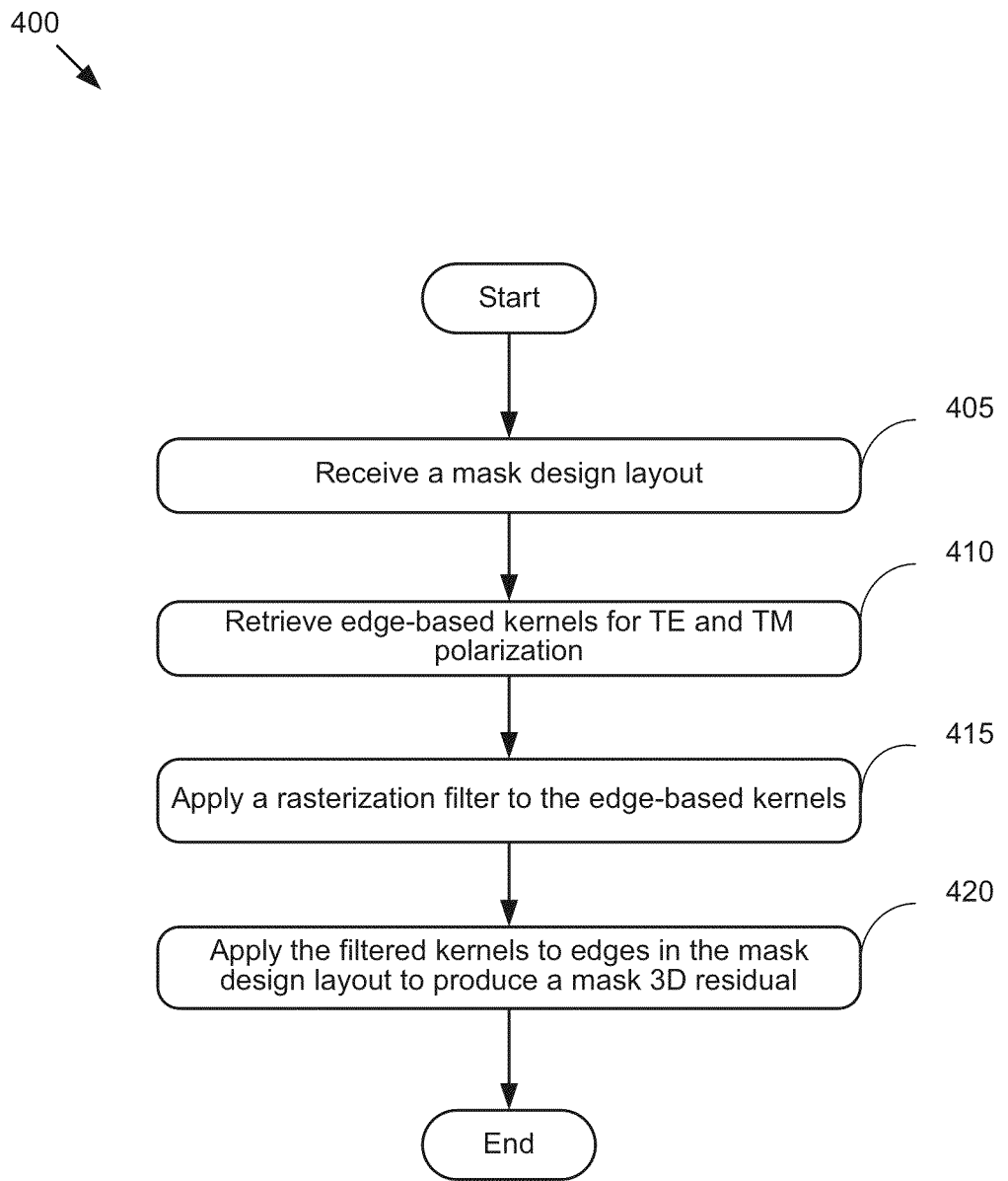
FIG. 4 is a flowchart of one embodiment of applying thick mask model to a mask design layout.

FIG. 4 is a flowchart of one embodiment of applying thick mask model to a mask design layout. Specifically, this figure describes a process 400 that applies edge-based kernels of the thick mask model. In one embodiment, the process 400 starts after a thick mask model has been generated, e.g., by the process described in FIG. 3 above. In one embodiment, the process 400 corresponds to block 215 described in FIG. 2 above. As shown in the figure, the process 400 begins by receiving, at block 405, a mask design layout. In one embodiment, the mask design layout is in the form of a polygon-based hierarchical data file in the GDS (Graphic Database System) or OASIS.MASK format.

At block 410, the process 400 retrieves edge-based kernels for TE polarization and TM polarization. In one embodiment, the edge-based kernels are generated by the process described in FIG. 3 above.

The process 400, at block 415, applies a rasterization filter to the edge-based kernels. In one embodiment, the preferred rasterization filter has the following criteria: maintaining high fidelity within optical bandwidth; attenuating the frequencies beyond mirror point of the optical bandwidth; having small spatial-domain ambit (e.g., no greater than 0.14 µm), and desired angular symmetry. In one embodiment, Fourier-Bessel orthogonal basis functions are used as the rasterization filter. One embodiment of the rasterization filter will be further described in FIG. 8 below.

At block 420, the process 400 applies the filtered kernels to edges in the mask design layout to produce a mask 3D residual. The mask 3D residual will be further described in FIG. 9 below. The process 400 then ends.

One of ordinary skill in the art will recognize that the process 400 is a conceptual representation of the operations used to apply the thick mask model. The specific operations of the process 400 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 400 is performed by one or more software applications that execute on one or more computers.

Figure 5:
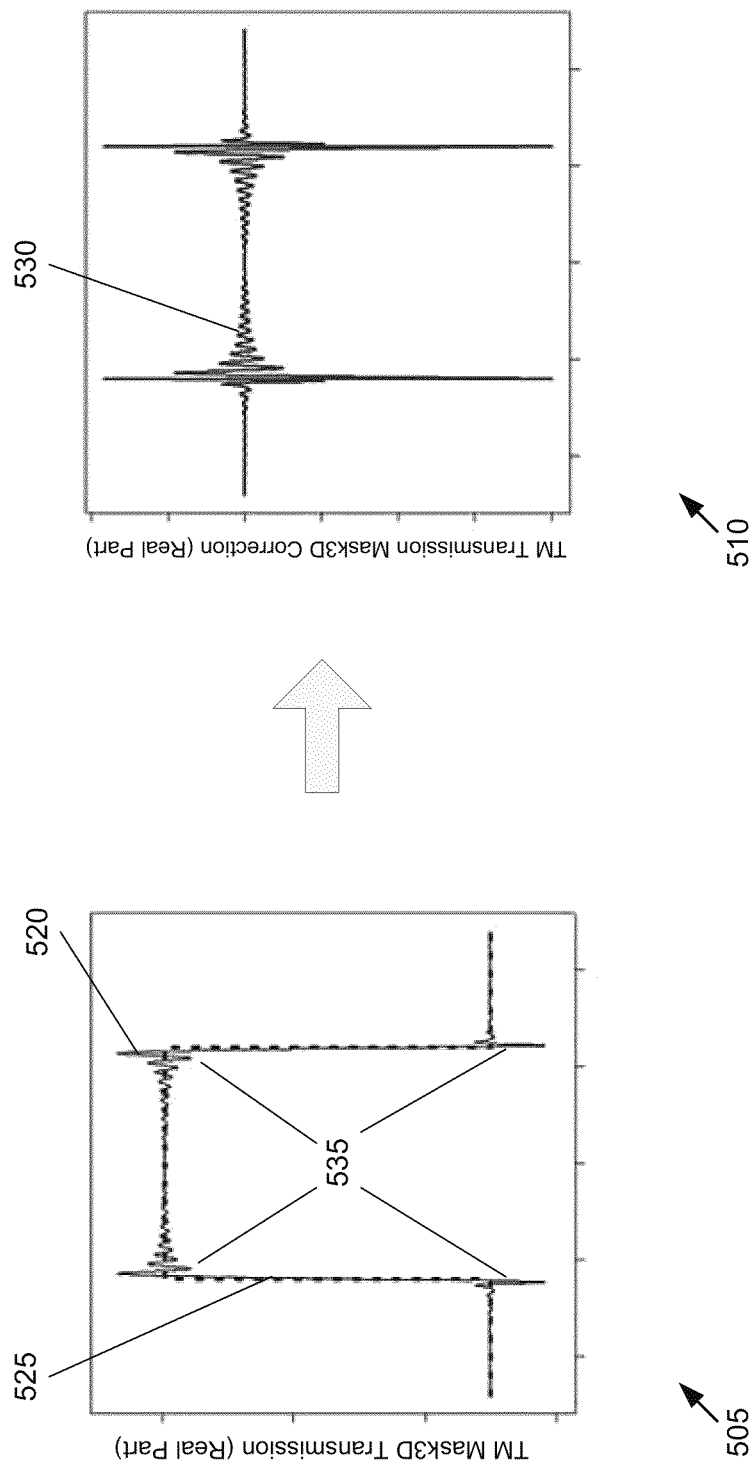
FIG. 5 conceptually illustrates an example of extracting a reference mask 3D residual.

FIG. 5 conceptually illustrates an example of extracting a reference mask 3D residual. Specifically, this figure illustrates the extraction of the mask 3D residual in two stages 505 and 510. In the first stage 505, a near-field 520 reflecting the mask topography effect is displayed. As shown in the figure, the near-field is basically a perturbed mask electric field 535 following the guidance of thin mask electric field 525 (illustrated by the dotted line).

In the second stage 510, a reference mask 3D residual 530 is extracted by subtracting the thin mask electric field 525 from the near-field 520. In one embodiment, a reference mask 3D residual 530 is obtained through subtracting the thin mask electric field 525 from a rigorously simulated near-field 520, as described in blocks 310 and 315 of FIG. 3 above. In one embodiment, the thin mask electric field can be gained with a rasterization with foreground and background transmission. In one embodiment, half-plane is used as the primitive in obtaining the simulated near-field 520. In another embodiment, the thin mask electric field is first biased or processed by a low-pass filter.

In one embodiment, a thick mask model derived from the reference mask 3D residual 530 is applied to a mask design layout to create a mask 3D residual. The mask 3D residual is then combined with a thin mask transmission to create a mask 3D transmission, as described in blocks 215 and 220 of FIG. 2 above.

Figure 6:
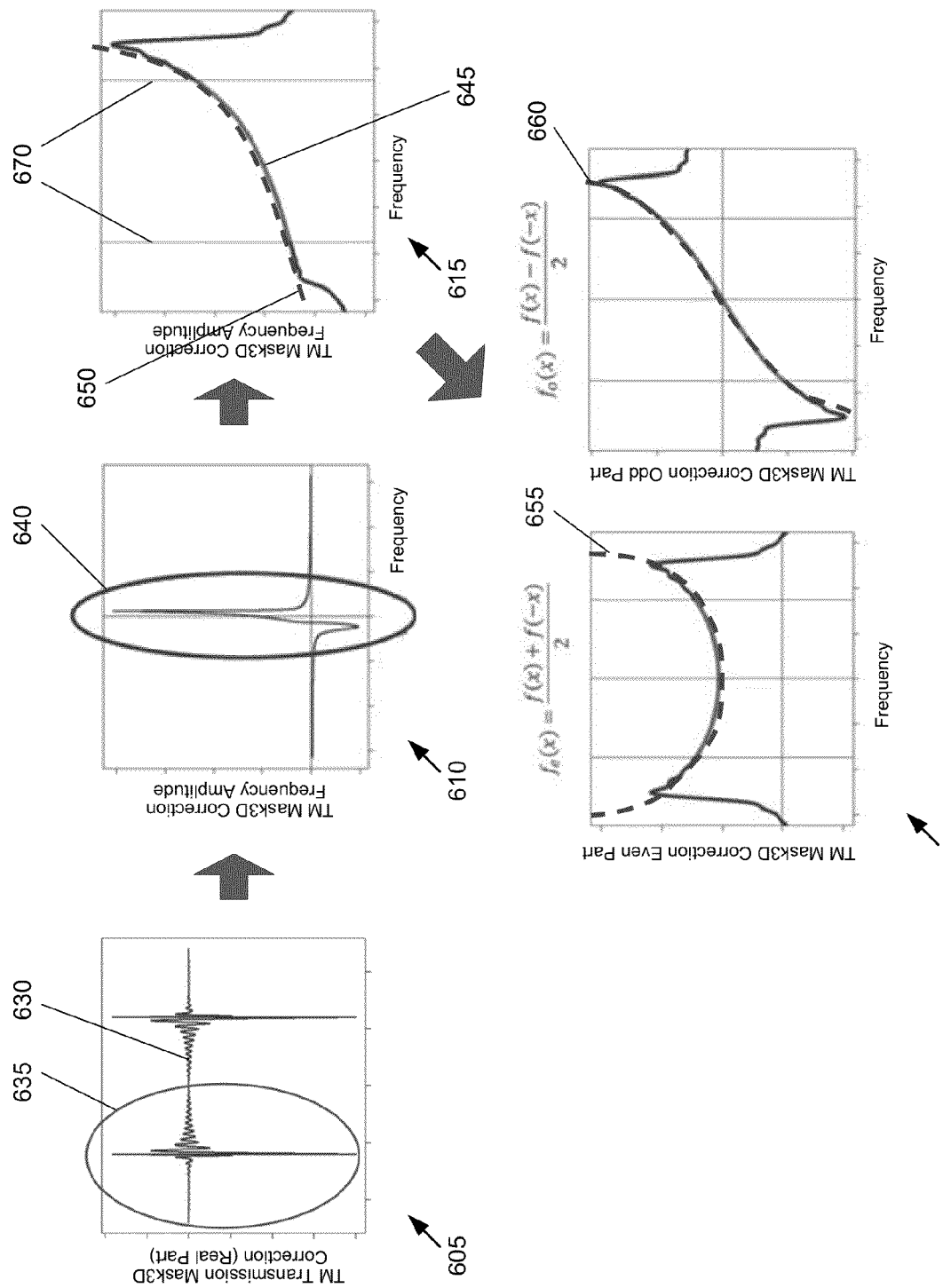
FIG. 6 illustrates an example of extracting edge-based kernels from a reference mask 3D residual.

FIG. 6 illustrates an example of extracting edge-based kernels from a reference mask 3D residual. Specifically, this figure illustrates, through four stages 605, 610, 615, and 620, extracting edge-based kernels for TE polarization from a reference mask 3D residual, as described in block 320 of FIG. 3 above. In one embodiment, extracting of edge-based kernel for TM polarization follows the same stages.

In the first stage 605, a reference mask 3D residual 630 is displayed as a function in the space domain. As shown in the figure, a half-plane 635 of the reference mask 3D residual 630 is extracted.

In the second stage 610, the half-plane 635 of the reference mask 3D residual 630 is transferred into the frequency domain as half-plane 640 using a Fourier Transform.

In the third stage 615, the half-plane 640 in frequency domain is zoomed in. The spectrum 645 in optical bandwidth 670 can be approximated by a smooth polynomial function $f(x)$ 650 (in dotted line), where x is the frequency component.

In the fourth stage 620, the function $f(x)$ 650 in the frequency domain is decomposed into an even component 655 (in dotted line) and an odd component 660 (in dotted line). This decomposition into the even and odd components enables accurate capture of the physical attributes of the edges in the optical mask. In one embodiment, given a function $f(x)$, the even component of $f(x)$ is obtained by $$f_e(x) = \frac{f(x) + f(-x)}{2},$$

and the odd component of $f(x)$ is obtained by $$f_o(x) = \frac{f(x) - f(-x)}{2}.$$

Figure 7:
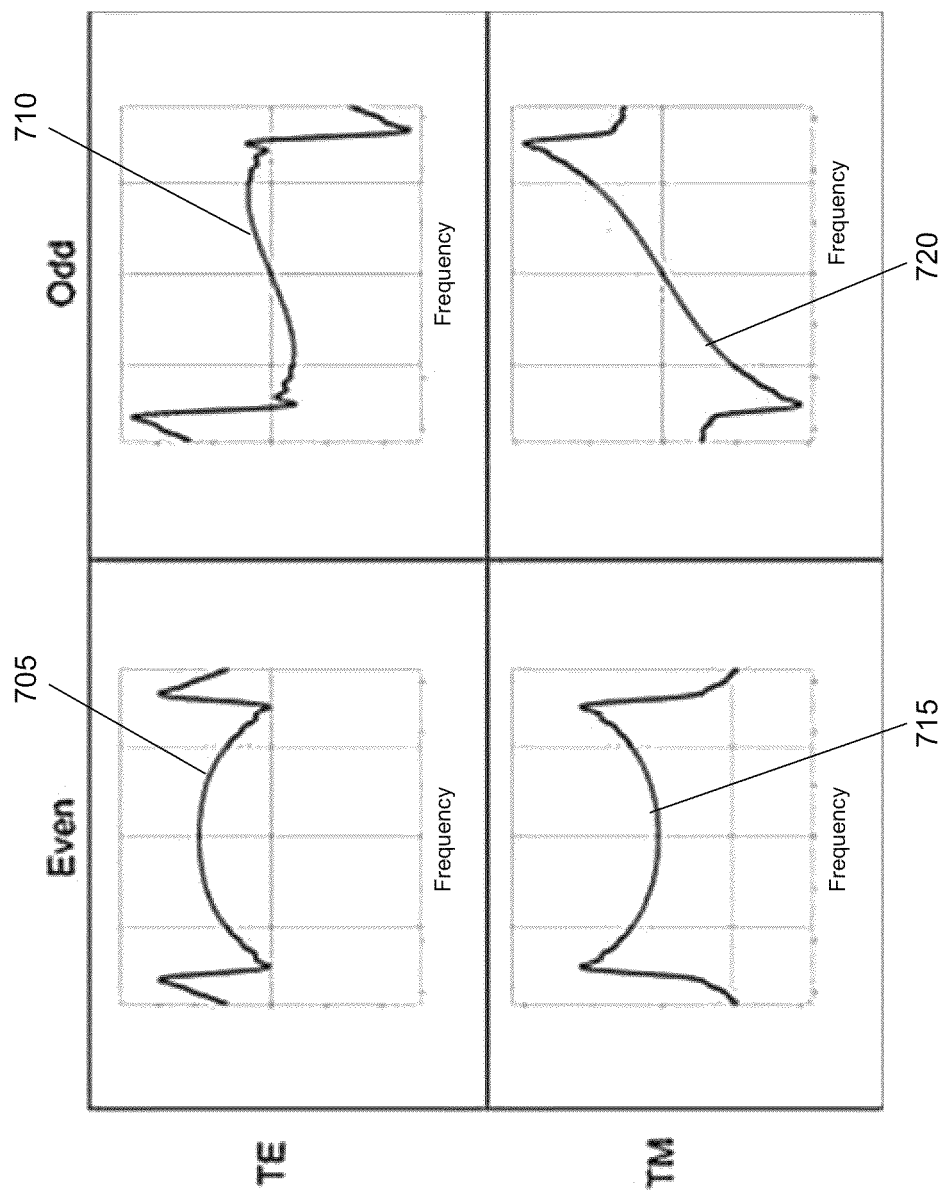
FIG. 7 conceptually illustrates an example of edge-based kernels derived from the reference mask 3D residual.

According to the polarization, the thick mask residual on a single edge can be considered as a unit edge response with TE and TM convolution kernel. FIG. 7 conceptually illustrates an example of edge-based kernels 705, 710, 715 and 720 derived from the reference mask 3D residual. The edge-based kernels 705 and 710 are the even and odd components decomposed from TE polarization. The edge-based kernels 715 and 720 are the even and odd components decomposed from TM polarization. In some of the following paragraphs, the even and odd components of TE or TM polarization are referred to as polarization and polarity matrices.

Figure 8B:
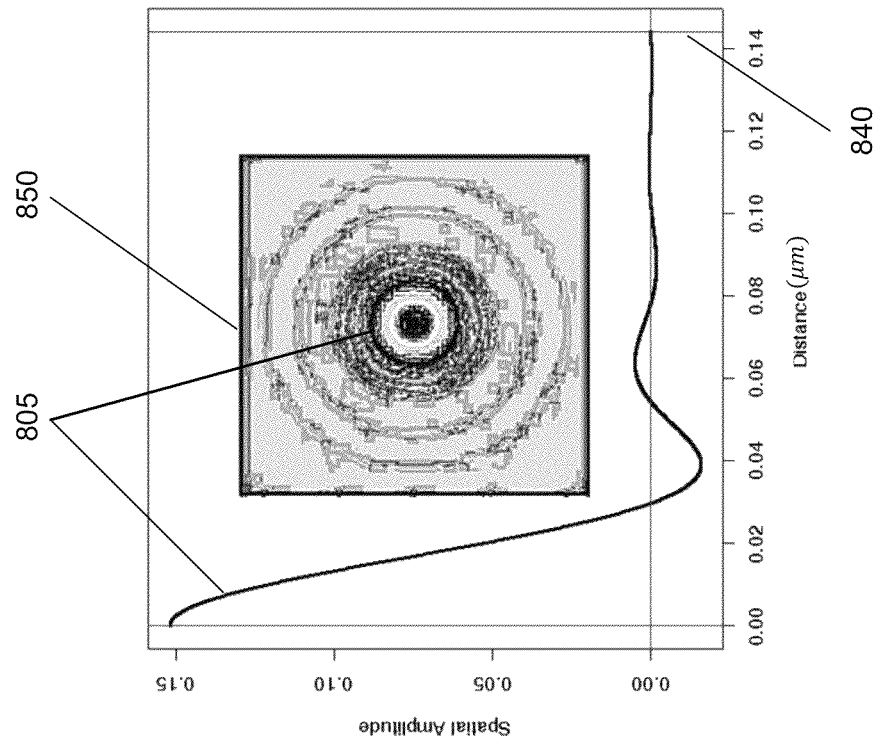
FIG. 8B conceptually illustrates an example of a rasterization filter in the spatial domain in a polar coordinate system.
Figure 8A:
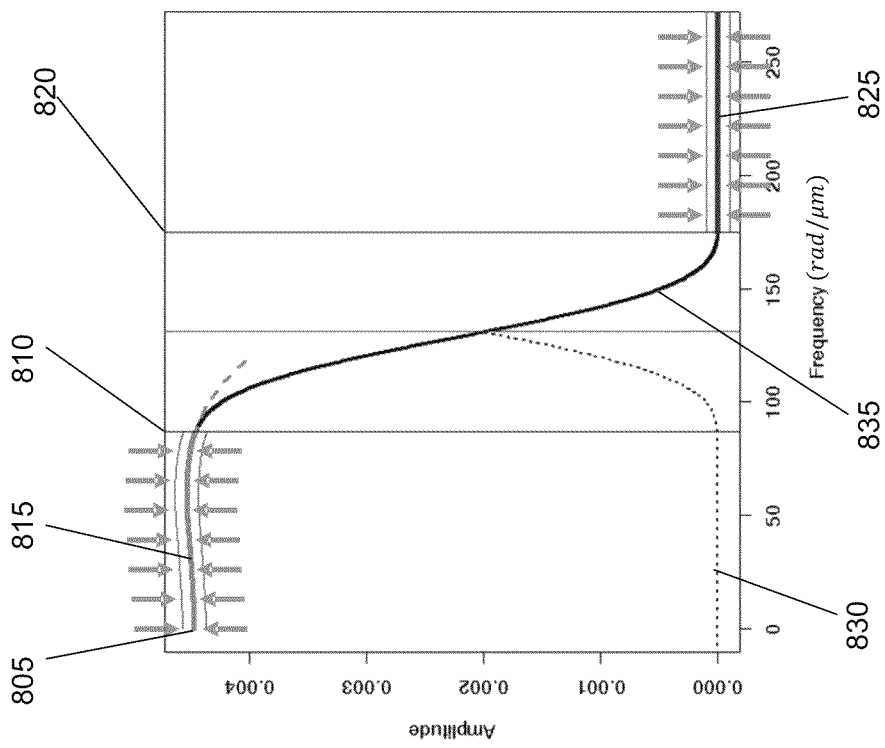
FIG. 8A conceptually illustrates an example of a rasterization filter in the frequency domain.

Once the edge-based kernels are extracted, they are applied to the edges in the mask design layout in a process called rasterization to generate a mask image. However, before the edge-based kernels can be applied in the rasterization process, they need to be filtered in order to enhance the quality and efficiency of the rasterization. FIGS. 8A and 8B conceptually illustrate an example of such a rasterization filter.

FIG. 8A conceptually illustrates an example of a rasterization filter in the frequency domain. Specifically, this figure shows the effects of the rasterization filter 805 on different segments of the edge-based kernels. As illustrated, the rasterization filter 805 has three continuous segments 815, 825, and 835, separated by the optical bandwidth 810 and the mirror point 820 of that optical bandwidth.

The rasterization filter 805 is required to maintain high fidelity within optical bandwidth 810, i.e., to preserve segment 815. The rasterization filter 805 also needs to ensure an output extremely close to zero beyond the mirror point 820, i.e., to filter out signals on segment 825 to maintain low noise. Therefore, the rasterization filter 805 also reduces the effect of spectrum aliasing 830 due to sampling, thus avoiding interference with signals on segment 815. The rasterization filter 805 does not need to care about the segment 835 between the optical bandwidth 810 and the mirror point 820.

FIG. 8B conceptually illustrates an example of a rasterization filter in the spatial domain in a polar coordinate system, where the x-axis is the distance to the original point. As illustrated, the rasterization filter 805 has small spatial domain ambit 840, so that the amount of computation for applying the edge-based kernels will be reduced after those kernels are filtered by the rasterization filter 805.

FIG. 8B displays the top view 850 of the rasterization filter 805. As shown, in one embodiment, the rasterization filter 805 is a series of wave circles with increasing radius. As such, the rasterization filter 805 achieves angular symmetry.

In one embodiment, the rasterization filter can be implemented by Fourier-Bessel orthogonal basis functions. In one embodiment, the rasterization filter is represented as $$K_m(r, \theta) = \sum_{i=1}^{n} c_{im} J_m\left(\frac{\alpha_{m,i} r}{R}\right) \cos(m\theta)$$

where
$K_m$ represents the rasterization filter for an even function of an edge-based kernel when m equals to 0, and represents the rasterization filter for an odd function of an edge-based kernel when m equals to 1,
$c_{im}$ is a coefficient for the rasterization filter,
$J_m$ is an m-order Bessel function of the first kind,
$a_{m,i}$ is the ith root of the m-order Bessel function of the first kind,
r is the distance,
$\theta$ is the angle, and
R is the maximum distance, i.e., ambit.

The purpose of the rasterization filter is to maintain high fidelity within optical bandwidth and to attenuate the frequencies beyond the mirror point. The rasterization filter does not concern about the segment between the optical bandwidth and the mirror point. The rasterization filter also needs to produce small spatial domain ambit (e.g., no greater than 0.14 μm) and desired angular symmetry.

Figure 9:
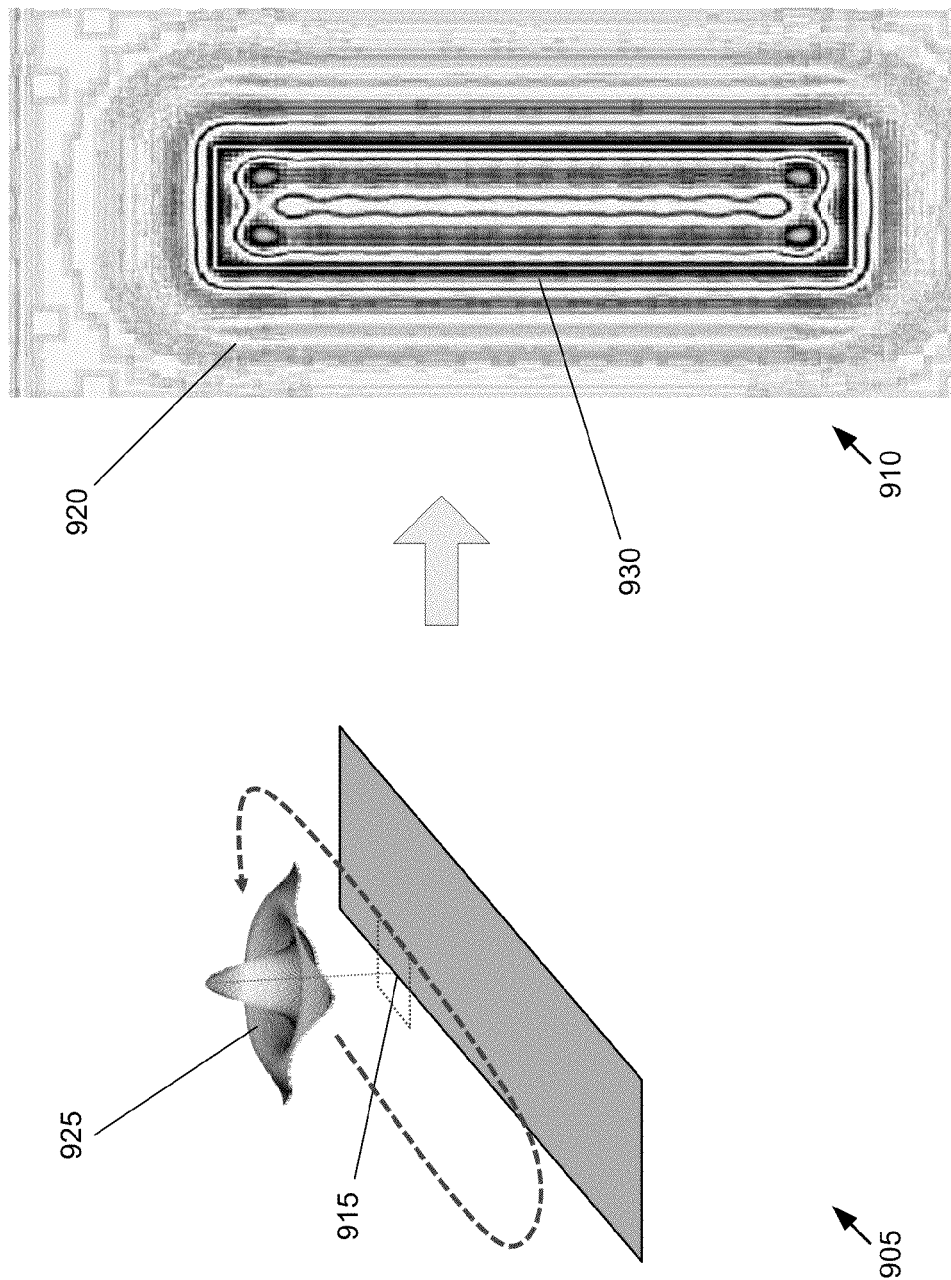
FIG. 9 illustrates an example of applying one of the edge-based kernels to the edges in a mask design layout.

In one embodiment, once the edge-based kernels are filtered by a rasterization filter, they are applied to the edges of a mask design layout. FIG. 9 illustrates an example of applying edge-based kernels to the edges in a mask design layout. Specifically, this figure shows the application of edge-based kernels to the mask design layout in two stages 905 and 910.

Conceptually, each point on a polygon edge emits some disturbance waves. The disturbance wave is edge orientation dependent. The superposition of all these disturbance waves becomes the 3D correction to the thin mask electric field. In the first stage 905, the edge-based kernels 925 are applied to each point (e.g., 915) on polygon edges.

In the second stage 910, as the result of applying the edge-based kernels to the edges, a mask image 920 is generated. The mask image 920 represents the mask 3D residual produced by the mask design layout. Polygon edge 930 is identified on the mask image 920. In one embodiment, the mask image 920 can be combined with a thin mask transmission to create a mask 3D transmission. Because the edge-based kernels capture the physical behavior of the mask, no special consideration is needed for line ends. Therefore, no artifacts are introduced near line ends.

Figure 10:
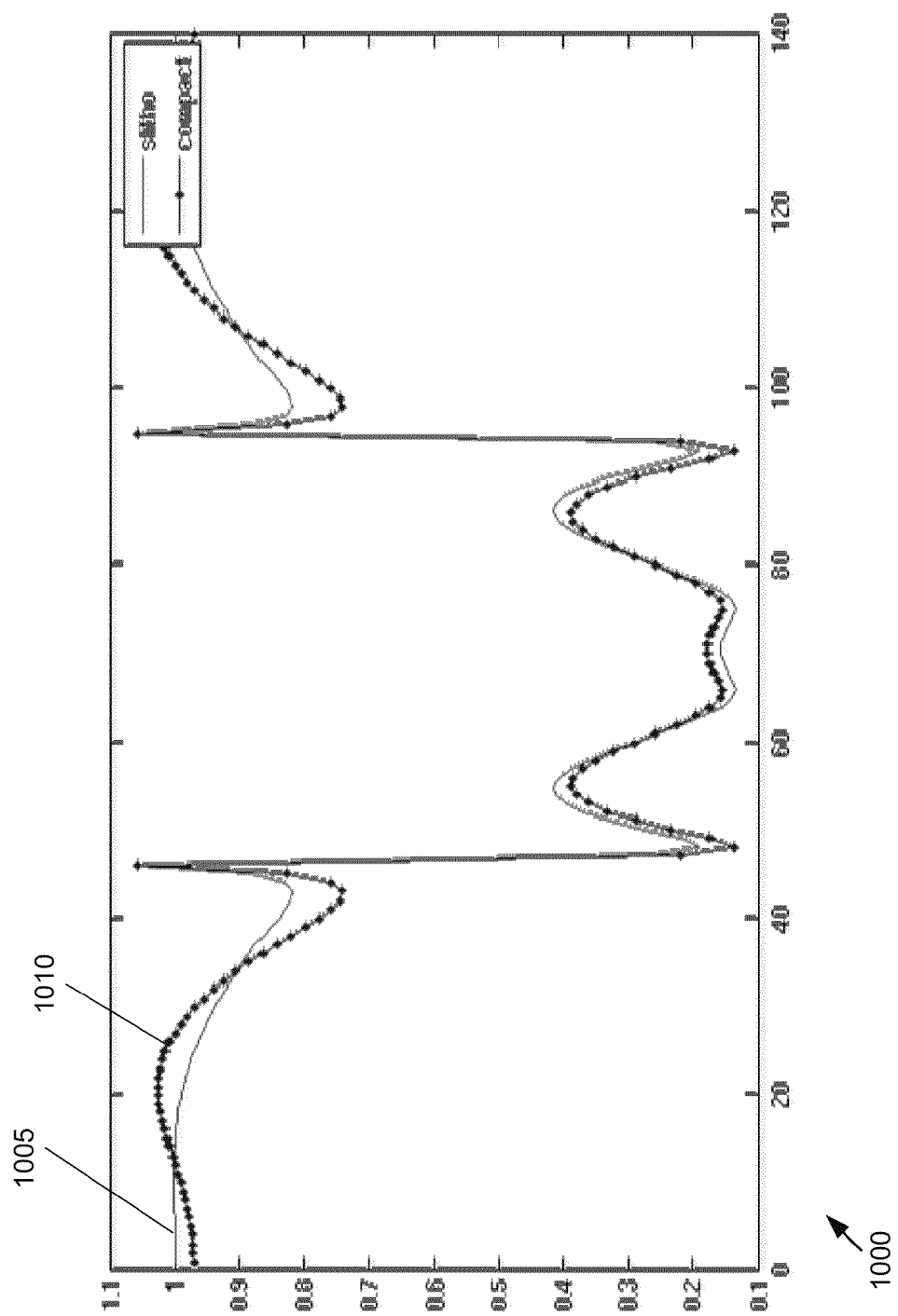
FIG. 10 illustrates an example of the impact of edge coupling effect on the near-field of mask topography effect.

In photolithography simulation, strong edge coupling effect will be generated when feature size and space are small. FIG. 10 illustrates an example of the impact of edge coupling effect on the near-field of mask topography effect. Specifically, the figure illustrates the difference between the near-field generated by rigorous simulation and the near-field generated by the edge-based simulation model described above.

As shown in FIG. 10, the chart 1000 displays two near-fields 1005 and 1010 of mask topography effect. The near-field 1005 (represented as a solid line) is generated by a rigorous simulation. The near-field 1010 (represented as a dotted line) is generated by the edge-based simulation model using half-plane. FIG. 10 shows that there is strong mismatch between the two near-fields 1005 and 1010 because the edge-based simulation model described above does not take edge coupling effect into consideration.

Figure 11:
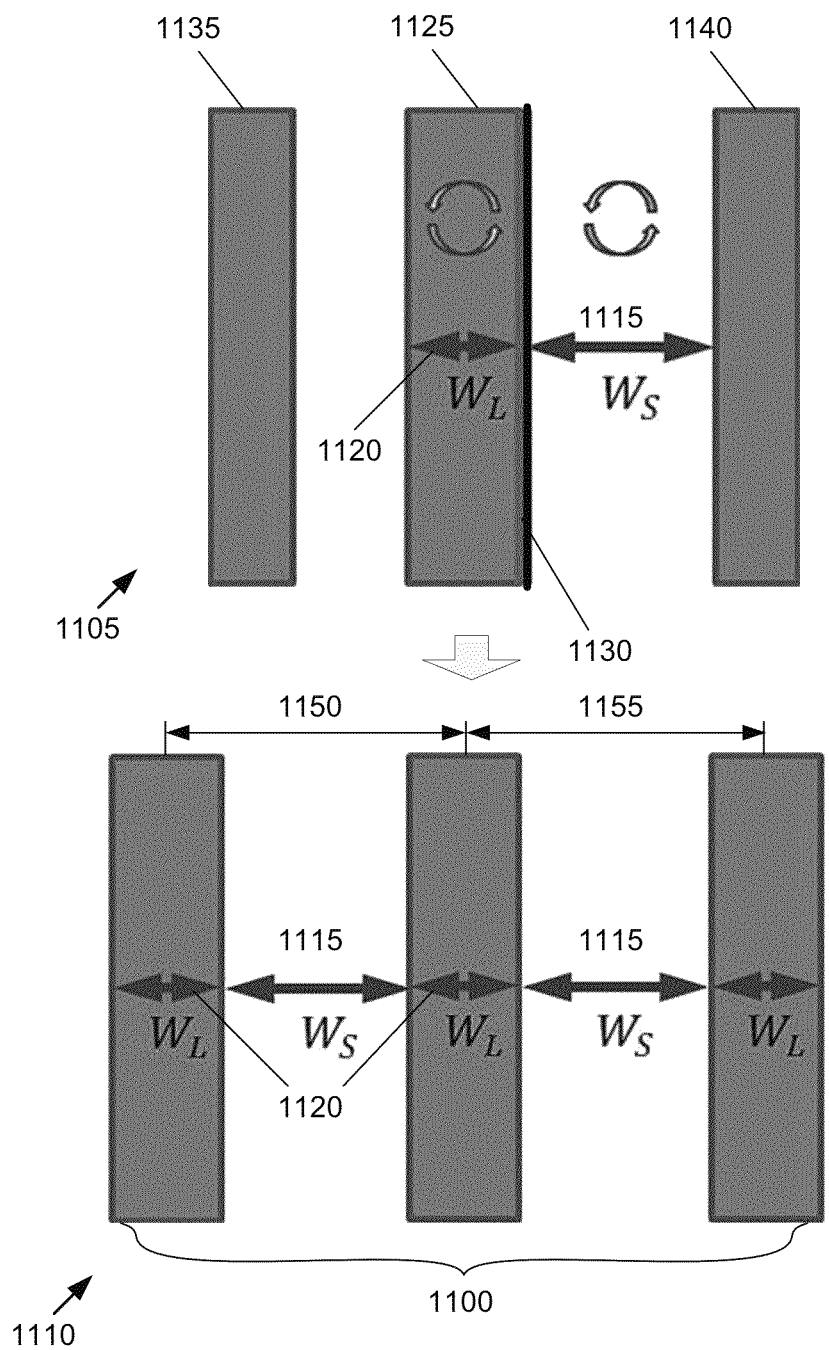
FIG. 11 illustrates an example of one embodiment for generating near-field reference for edge coupling effect.

FIG. 11 illustrates an example of one embodiment for generating near-field reference for edge coupling effect. Specifically, this figure shows generating a reference near-field for edge coupling effect by using a periodic feature structure 1100. The generation of the reference near-field is illustrated in two stages 1105 and 1110.

In the first stage 1105, three features 1125, 1135, and 1140 of a bi-tone mask are displayed. A bi-tone mask is a simple mask that is described by two colors to represent features and non-features on the mask. Edge 1130 is one of the edges of feature 1125. The width of feature 1125 is $W_L$ 1120. The space between features 1125 and 1140 is $W_S$ 1115. In one embodiment, the edge coupling effect on edge 1130 is assumed to be completely determined by two distance parameters: feature width $W_L$ 1120 and feature space $W_S$ 1115.

In the second stage 1110, the periodic feature structure 1100 is created for the bi-tone mask. Two periods 1150 and 1155 of the periodic feature structure 1100 are shown in FIG. 11. In one embodiment, each feature in the periodic feature structure 1100 has a feature width of $W_L$ 1120. In one embodiment, each space between features in the periodic feature structure 1100 is $W_S$ 1115. In one embodiment, the reference near-field for edge coupling effect with feature width $W_L$ 1120 and feature space $W_S$ 1115 can be generated based on the periodic feature structure 1100.

A periodic feature structure for a bi-tone mask is described above. One of ordinary skill in the art will recognize that periodic feature structures can also be created for multi-tone masks, which are described by more than two colors.

Figure 12:
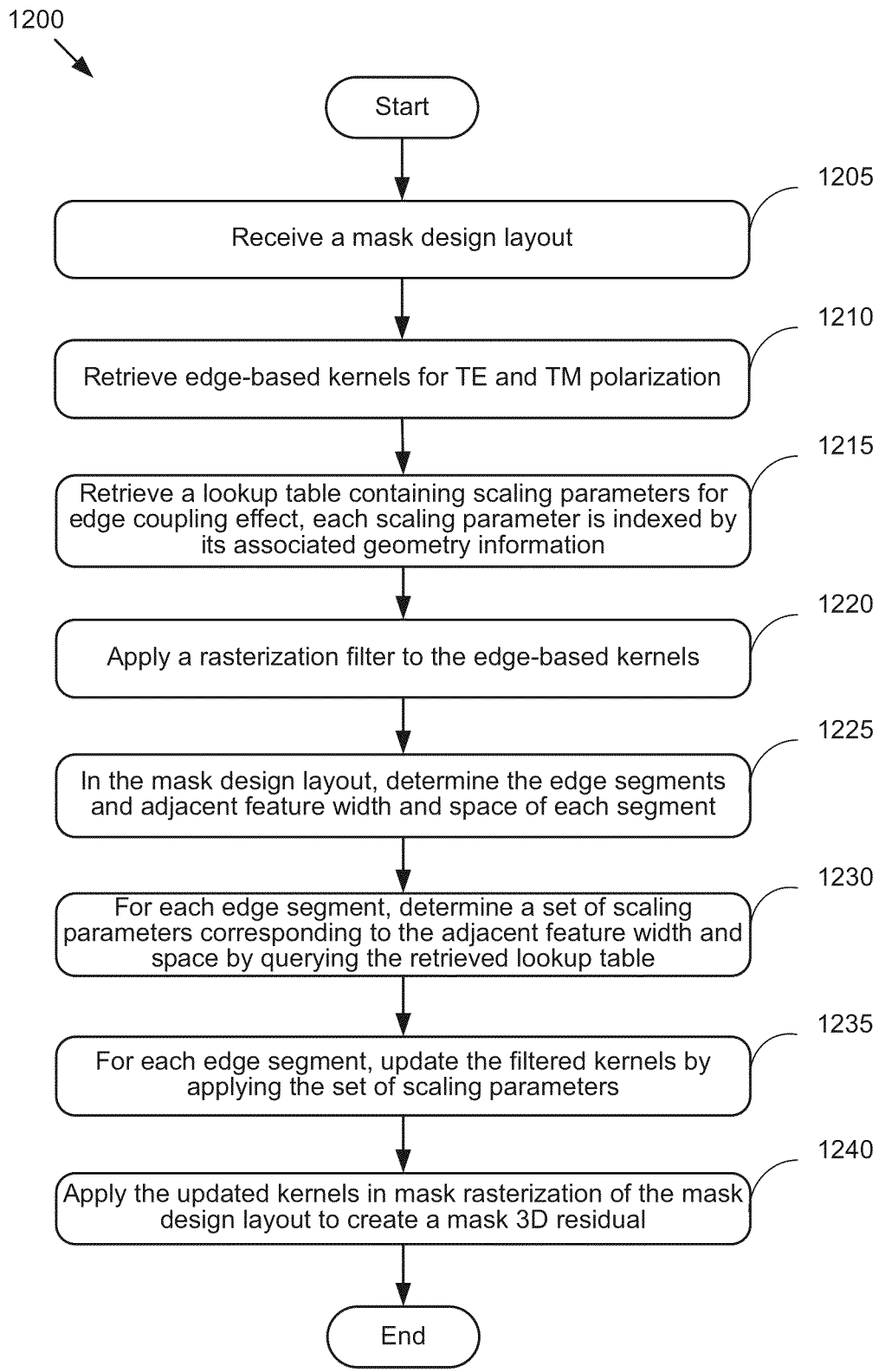
FIG. 12 is a flowchart of one embodiment of applying thick mask model that captures edge coupling effect in a mask design layout.

FIG. 12 is a flowchart of one embodiment of applying thick mask model that captures edge coupling effect in a mask design layout. Specifically, this figure describes a process 1200 that adjusts edge-based kernels of the thick mask model with scaling parameters for edge coupling effect and applies the adjusted kernels in generating mask image. In one embodiment, the process 1200 starts after a lookup table containing scaling parameters for edge coupling effect has been generated. In one embodiment, the table is generated by the process described in FIG. 13 or FIG. 17 below. In one embodiment, the process 1200 corresponds to block 215 described in FIG. 2 above. As shown in the figure, the process 1200 begins by receiving, at block 1205, a mask design layout. In one embodiment, the mask design layout is in the form of a polygon-based hierarchical data file in the GDS (Graphic Database System) or OASIS.MASK format.

At block 1210, the process 1200 retrieves edge-based kernels for TE polarization and TM polarization. In one embodiment, the edge-based kernels are generated by the process described in FIG. 3 above.

At block 1215, the process 1200 retrieves a lookup table containing scaling parameters for edge coupling effect. In one embodiment, each scaling parameter in the lookup table is indexed by its associated geometry information. In one embodiment, the geometry information is a combination of feature width and feature space. In one embodiment, the lookup table is generated by a process described in FIG. 13 or FIG. 17 below.

The process 1200, at block 1220, applies a rasterization filter to the edge-based kernels. In one embodiment, the preferred rasterization filter has the following criteria: maintaining high fidelity within optical bandwidth; attenuating the frequencies beyond mirror point of the optical bandwidth; having small spatial-domain ambit (e.g., no greater than 0.14 µm) and desired angular symmetry. In one embodiment, Fourier-Bessel orthogonal basis functions are used as the rasterization filter. One embodiment of the rasterization filter is described in FIG. 8 above.

At block 1225, the process 1200 determines the edge segments in the mask design layout and the adjacent feature width and space of each edge segment. For each edge segment, the process 1200, at block 1230, determines a set of scaling parameters corresponding to the adjacent feature width and space by querying the retrieved lookup table using the adjacent feature width and space.

For each edge segment, at block 1235, the process 1200 updates the filtered kernels by applying the set of scaling parameters determined for the edge segment. In one embodiment, the set of scaling parameters includes four scaling parameters, each of which is applied to one of the even and odd components of TE and TM polarization kernels. For example, in one embodiment, for TE polarization, the updated kernels $K_1$ and $K_2$ can be calculated by, $$K_1 = p_1(w,p) \times K_{even}$$

$$K_2 = p_2(w,p) \times K_{odd}$$

where
$K_{even}$ and $K_{odd}$ are original edge-based even and odd component kernels, respectively,
$p_1(w, p)$ and $p_2(w, p)$ are scaling parameters associated with feature width w and space p.

The process 1200, at block 1240, applies the updated kernels in mask rasterization to edges in the mask design layout to produce a mask 3D residual. The mask 3D residual is described in FIG. 9 above. The process 1200 then ends.

One of ordinary skill in the art will recognize that the process 1200 is a conceptual representation of the operations used to apply the thick mask model. The specific operations of the process 1200 may not be performed in the exact order shown and described. For example, the edge-based kernels can be updated with the scaling parameters before being filtered by the rasterization filter. The specific operations may not be performed in one continuous series of operations, and different specific operations may be performed in different embodiments. Furthermore, the process could be implemented using several sub-processes, or as part of a larger macro process. For instance, in some embodiments, the process 1200 is performed by one or more software applications that execute on one or more computers.

Figure 13:
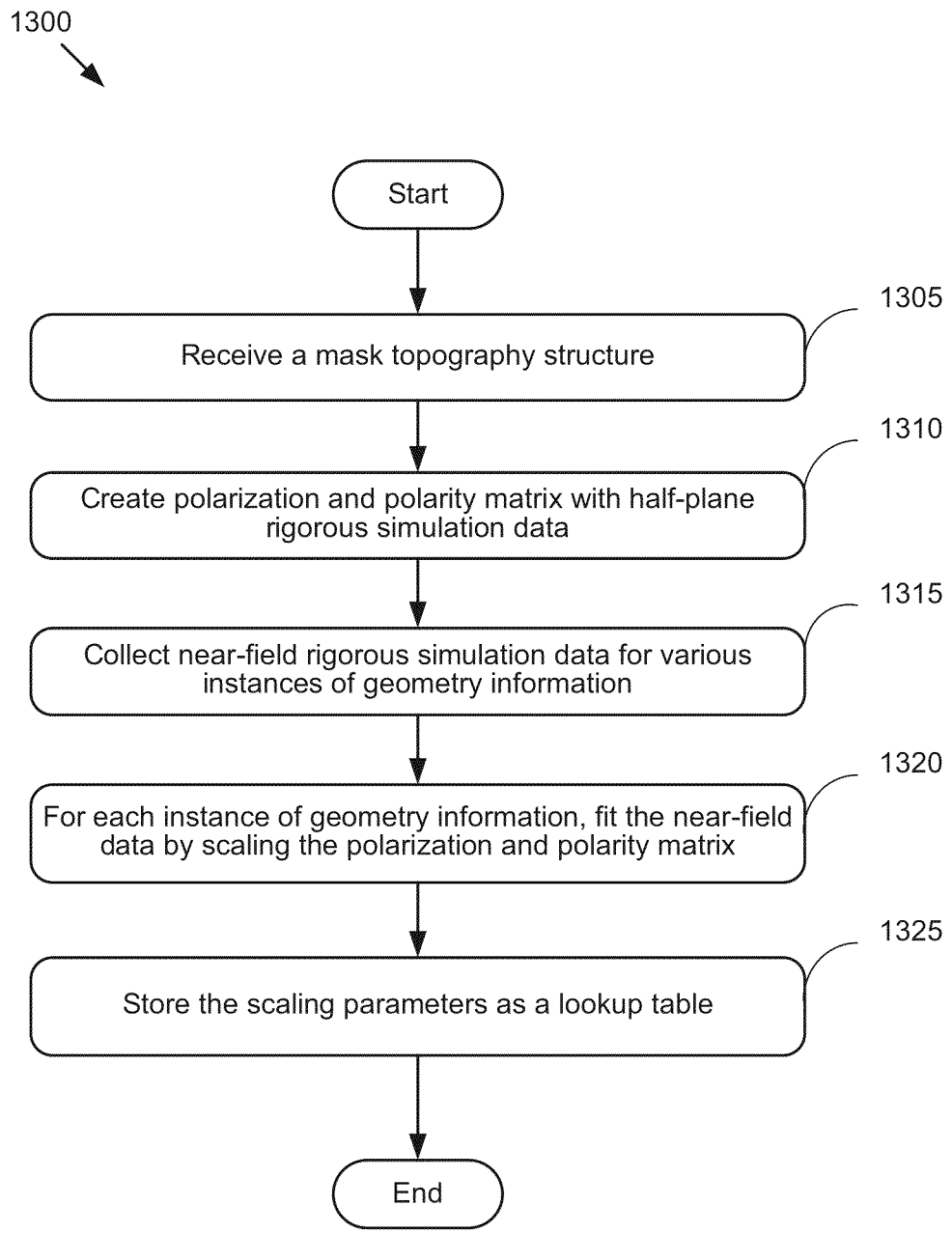
FIG. 13 is a flowchart of one embodiment of building a lookup table that stores scaling parameters for edge coupling effect.

FIG. 13 is a flowchart of one embodiment of building a lookup table that stores scaling parameters for edge coupling effect. Specifically, this figure describes a process 1300 that uses linear regression to fit scaling parameters for various instances of geometry information related to edge coupling effect. In one embodiment, the process 1300 starts before a thick mask model that can capture edge coupling effect needs to be applied, e.g., by the process described in FIG. 12 above. As shown in the figure, the process 1300 begins by receiving, at block 1305, a mask topography structure. The mask topography structure is the physical 3D structure of the real mask that could distort the near-field image of mask from the ideal thin mask model. In one embodiment, the mask topography structure is a combination of factors, including material, geometry setting and process variations, in mask making and implementations.

At block 1310, the process 1300 creates polarization and polarity matrix with half-plane rigorous simulation data. In one embodiment, polarization and polarity matrix is based on the edge-based kernels described in FIGS. 3 and 6 above.

At block 1315, the process 1300 collects near-field rigorous simulation data for various instances of geometry information. In one embodiment, each instance of geometry information is a combination of feature width and feature space. In one embodiment, the above-mentioned near-field rigorous simulation data is collected by using periodic feature structures described in FIG. 11 above.

For each instance of geometry information, the process 1300, at block 1320, fits the near-field rigorous simulation data by scaling the polarization and polarity matrix using linear regression. For example and in one embodiment, linear regression is performed on the equations below to solve for scaling parameters p1 and p2 for an instance of geometry information:

$$K_{even}(x_1) \times p_1 + K_{odd}(x_1) \times p_2 = K(x_1)$$

$$K_{even}(x_i) \times p_1 + K_{odd}(x_i) \times p_2 = K(x_i)$$

$$\dots$$

$$K_{even}(x_n) \times p_1 + K_{odd}(x_n) \times p_2 = K(x_n)$$

where $K_{even}$ and $K_{odd}$ constitute the polarization and polarity matrix created in block 1310 described above, K represents the near-field rigorous simulation data for the instance of geometry information, $x_1 \dots x_n$ are n discrete frequency components within optical bandwidth for the instance of geometry information.

At block 1325, the process 1300 stores the scaling parameters obtained above through linear regression. In one embodiment, the scaling parameters are stored as a lookup table. The process 1300 then ends.

One of ordinary skill in the art will recognize that the process 1300 is a conceptual representation of the operations used to build a lookup table that stores scaling parameters for edge coupling effect. The specific operations of the process 1300 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 1300 is performed by one or more software applications that execute on one or more computers.

In one embodiment, the lookup table with scaling parameters for various instances of geometry information is generated once and can be reused as long as the mask structure is unchanged. It takes constant time to look up the scaling parameters and apply them to the mask rasterization.

As described in block 1225 of FIG. 12 above, to address edge coupling effect, edge segments in a mask design layout and adjacent feature width and space of each edge segment are determined. FIG. 14A-14B illustrates an example of one embodiment to use scanline algorithm to determine edge segments and adjacent feature width and space.

FIG. 14A illustrates using vertical scan to determine vertical edge segments and adjacent feature width and space. Specifically, this figure shows performing vertical scan on a mask design layout 1400. As a result of the vertical scan, vertical edge segments, such as edge segment 1405 is detected, as well as the adjacent feature width 1415 and space 1410 of the edge segment 1405.

FIG. 14B illustrates using horizontal scan to determine horizontal edge segments and adjacent feature width and space. Specifically, this figure shows performing horizontal scan on the mask design layout 1400. As a result of the horizontal scan, horizontal edge segments, such as edge segment 1420, are detected, as well as the adjacent feature width 1430 and space 1425 of the edge segment 1420.

For a particular layer of the IC fabrication process, the pitch specifies the periodical structure's periodical length. For 1D type pattern, the pitch is a sum of the width of the feature and the space on one side of the feature separating that feature from a neighboring feature on the same layer. In a single exposure process, the minimum pitch represents the smallest pitch that is allowed to have the periodical structure printed. In photolithography simulation using reference near-field generation, when the sum of feature width and space is smaller than the minimum pitch, only the DC component of the near-field can pass through the optical bandwidth. There is not enough information for edge coupling factor calculation, thus the simulation result is not likely to be very accurate.

FIG. 15 illustrates an example of one embodiment for generating near-field reference for edge coupling effect on small features. Specifically, this figure shows generating a reference near-field for edge coupling effect for small features (sum of feature width and space is smaller than the minimum pitch) by using a periodic feature structure 1500 that is augmented with auxiliary patterns (e.g., large feature width and space, whose sum is larger than or equal to the minimum pitch). An example of a small feature is a sub-resolution assistant feature (SRAF). The generation of the reference near-field is illustrated in two stages 1505 and 1510.

In the first stage 1505, three features 1525, 1535, and 1540 of a bi-tone mask are displayed. A bi-tone mask is a simple mask that is described by two colors to represent features and non-features on the mask. Edge 1530 is one of the edges of feature 1525. The width of feature 1525 is $W_L$ 1520. The space between features 1525 and 1540 is $W_S$ 1515. In one embodiment, the edge coupling effect on edge 1530 is assumed to be completely determined by two distance parameters: feature width $W_L$ 1520 and feature space $W_S$ 1515.

In the second stage 1510, the periodic feature structure 1500 is created for the bi-tone mask. A period 1550 of the periodic feature structure 1500 is shown in FIG. 15. In one embodiment, in addition to two small features 1555 and 1560, the periodic feature structure 1500 includes two large features 1565 and 1570. The width of the two small features 1555 and 1560 is $W_L$ 1520. The space between the two small features 1555 and 1560 is $W_S$ 1515, which is relatively small. The width of the two large features 1565 and 1579 is W 1575. The space between a large feature and a small feature is S 1580, which is relatively large compared to $W_S$ 1515.

In one embodiment, the reference near-field for edge coupling effect with feature width $W_L$ 1520 and feature space $W_S$ 1515 can be generated based on the periodic feature structure 1500. The large features and large spaces are introduced as auxiliary patterns because the large features and spaces can capture more reliable frequency components. In one embodiment, the large features and spaces are introduced to mimic the real scenario, where small features are placed adjacent to large features. The periodic feature structure 1500 is also a simple structure in terms of pattern complexity and permits fast runtime in simulation of the mask.

A periodic feature structure for a bi-tone mask is described above. One of ordinary skill in the art will recognize that periodic feature structures can also be created for multi-tone masks, which are described by more than two colors. One of ordinary skill in the art will also realize that the periodic feature structure 1500 described above is only one embodiment of the periodic feature structure.

Other embodiments of the periodic feature structure can be used to generate the reference near-field for edge coupling effect with feature width $W_L$ 1520 and feature space $W_S$ 1515. For example and in one embodiment, instead of having two small features in each period, the periodic feature structure can have one small feature or more than two small features in each period. In one embodiment, instead of having two large features in each period, the periodic feature structure can have one large feature or more than two large features in each period. In one embodiment, the relative position of each feature within the periodic feature structure can be rearranged to mimic a real scenario.

Figure 16:
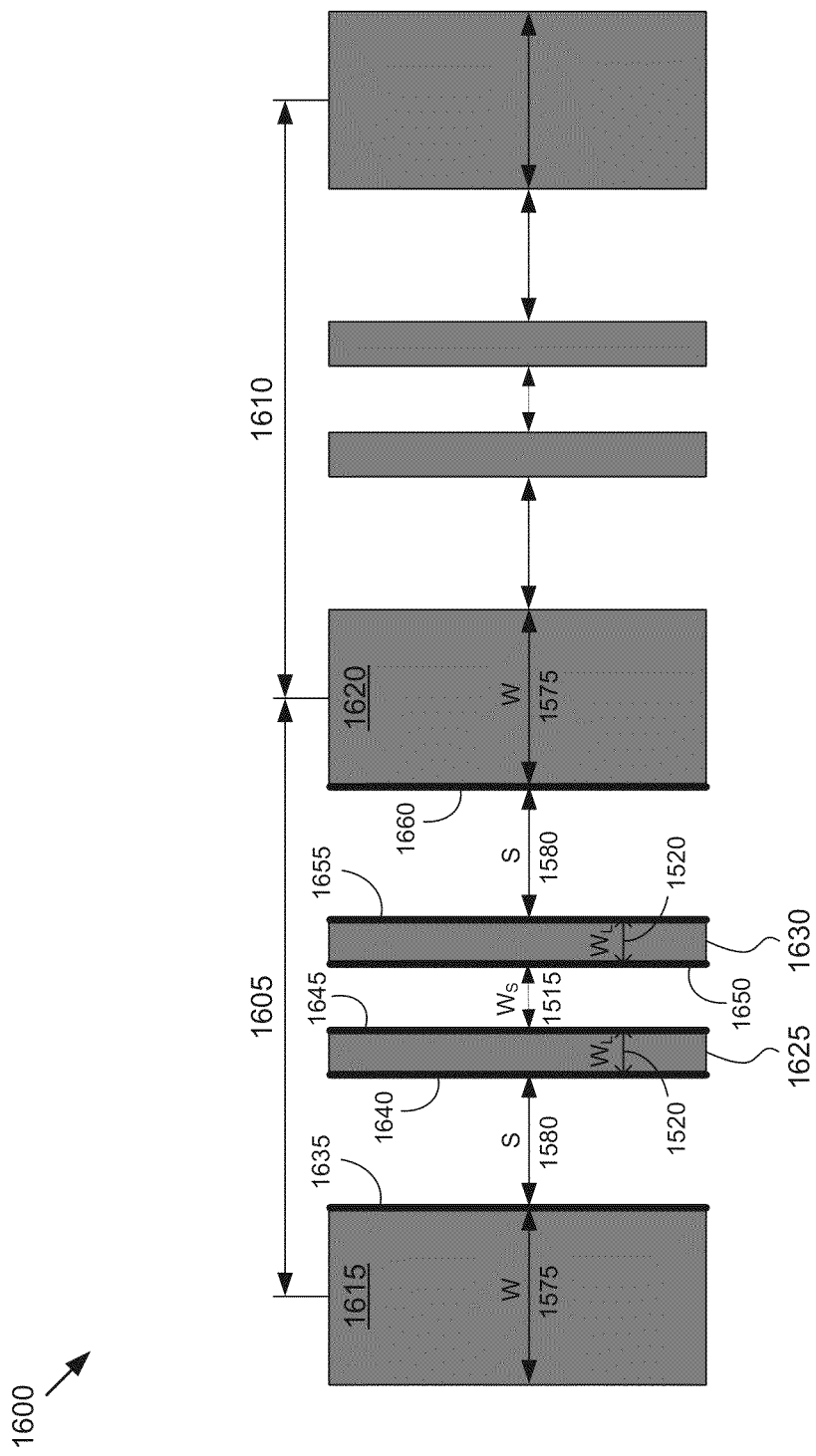
FIG. 16 conceptually illustrates one embodiment of a periodic feature structure that can be used to generate near-field reference for edge coupling effect on small features.

FIG. 16 conceptually illustrates one embodiment of a periodic feature structure 1600 that can be used to generate near-field reference for edge coupling effect on small features. Specifically, this figure shows how to use auxiliary patterns (e.g., large feature width and feature space whose sum is larger than or equal to the minimum pitch) to extract edge-based near-field data for small features whose sum of feature width and space is smaller than the minimum pitch. As illustrated, this figure shows two periods 1605 and 1610 of the periodic feature structure 1600.

In addition to two small features 1625 and 1630, the periodic 1605 includes a half portion of two large features 1615 and 1620. The width of the two small features 1625 and 1630 is $W_L$ 1520. The space between the two small features 1625 and 1630 is $W_S$ 1515, which is relatively small. The width of the two large features 1615 and 1620 is W 1575. The space between a large feature and a small feature is S 1580, which is relatively large compared to $W_S$ 1515.

Six edges 1635-1660 in the period 1605 may cause edge coupling effect. The edge coupling effect for each edge is assumed to be completely determined by the feature width and space associated with the edge. Because each of edges 1635, 1640, 1655, and 1660 is associated with either a large feature width W 1575, a large space S 1580, or both, the sum of the feature width and space for each of them is larger than or equal to the minimum pitch. Therefore, the edge-based near-field for each of edges 1635, 1640, 1655, and 1660 can be determined with high degree of accuracy by using the method described with respect to FIGS. 12 and 13 above.

Each of edges 1645 and 1650 is associated with a small feature width $W_L$ 1520 and a small space $W_S$ 1515; the sum of the feature width and space for each of them is smaller than the minimum pitch. Therefore, the edge-based near-field for each of edges 1645 and 1650 cannot be determined with a high degree of accuracy by using the method described with respect to FIGS. 12 and 13 above. In one embodiment, the edge-based near-field for edges 1645 and 1650 can be extracted by subtracting the edge-based near-field for edges 1635, 1640, 1655, and 1660 from the reference near-field for the periodic feature structure 1600. The edge-based near-field for edges 1645 and 1650 can then be used to perform a fitting process to get the edge coupling effect scaling factors for small features whose sum of feature width and space is smaller than the minimum pitch.

Figure 17:
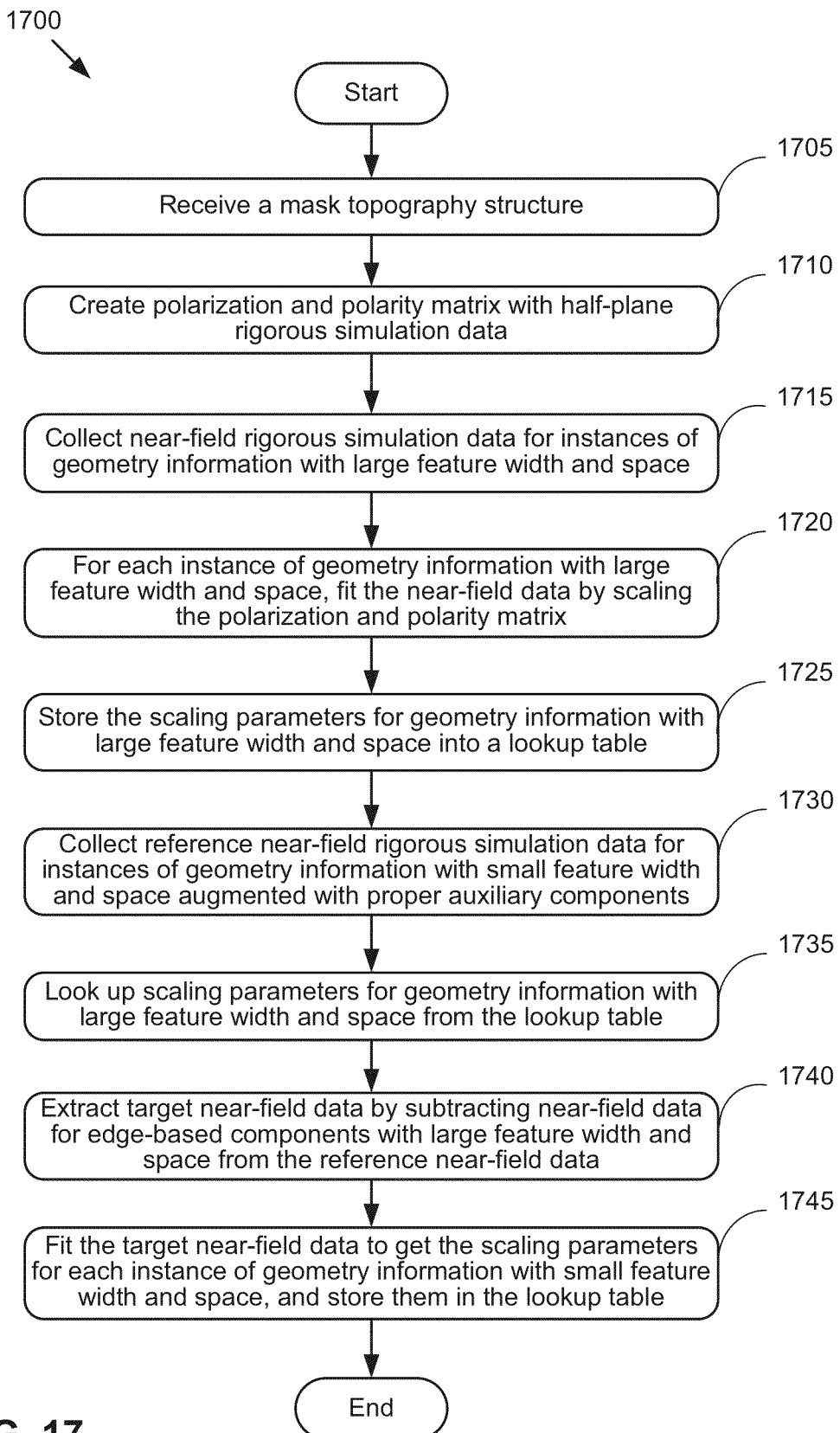
FIG. 17 is a flowchart of one embodiment of building a lookup table that stores scaling parameters for edge coupling effect on small features.

FIG. 17 is a flowchart of one embodiment of building a lookup table that stores scaling parameters for edge coupling effect on small features. Specifically, this figure describes a process 1700 that uses linear regression to fit scaling parameters for various instances of geometry information related to edge coupling effect, including instances of geometry information whose sum of feature width and space is smaller than the minimum pitch. In one embodiment, the process 1700 starts before a thick mask model that can capture edge coupling effect needs to be applied, e.g., by the process described in FIG. 12 above.

As shown in the figure, the process 1700 begins by receiving, at block 1705, a mask topography structure. The mask topography structure is the physical 3D structure of the real mask that could distort the near-field image of the mask if simulated by using the ideal thin mask model. In one embodiment, the mask topography structure is a combination of factors, including material, geometry setting and process variations, in mask making and implementations.

At block 1710, the process 1700 creates polarization and polarity matrix with half-plane rigorous simulation data. In one embodiment, polarization and polarity matrix are based on the edge-based kernels described in FIGS. 3 and 6 above.

At block 1715, the process 1700 collects near-field rigorous simulation data for instances of geometry information with large feature width and space. In one embodiment, each instance of geometry information is a combination of feature width and space. Specifically, the process 1700 collects near-field rigorous simulation data for instances of geometry information whose sum of feature width and space is larger than or equal to the minimum pitch. In one embodiment, the above-mentioned near-field rigorous simulation data is collected by using periodic feature structures as described with respect to FIG. 11 above.

For each instance of geometry information with large feature width and space, in one embodiment, the process 1700, at block 1720, fits the near-field rigorous simulation data by scaling the polarization and polarity matrix using linear regression. For example and in one embodiment, linear regression is performed on the equations below to solve for scaling parameters p1 and p2 for an instance of geometry information:

$$K_{even}(x_1) \times p_1 + K_{odd}(x_1) \times p_2 = K(x_1)$$

$$K_{even}(x_i) \times p_1 + K_{odd}(x_i) \times p_2 = K(x_i)$$

$$\ldots$$

$$K_{even}(x_n) \times p_1 + K_{odd}(x_n) \times p_2 = K(x_n)$$

where
- $K_{even}$ and $K_{odd}$ constitute the polarization and polarity matrix created in block 1710 described above,
- K represents the near-field rigorous simulation data for the instance of geometry information with large feature width and space,
- $x_1 \ldots x_n$ are n discrete frequency components within optical bandwidth (i.e., within the width of the optical spectrum of the output of light source) for the instance of geometry information.

At block 1725, the process 1700 stores the scaling parameters for geometry information with large feature width and space obtained above through linear regression. In one embodiment, the scaling parameters are stored as a lookup table.

At block 1730, the process 1700 collects reference near-field rigorous simulation data for instances of geometry information with small feature width and space. In one embodiment, each instance of geometry information is a combination of feature width and space. Specifically, the process 1700 collects reference near-field rigorous simulation data for instances of geometry information whose sum of feature width and space is smaller than the minimum pitch. In one embodiment, the above-mentioned reference near-field rigorous simulation data is collected by using the periodic feature structure described in FIGS. 15 and 16 above. In one embodiment, the process 1700 generates a periodic feature structure for each instance of geometry information with small feature width and space to mimic the real scenario related to the instance of geometry information.

At block 1735, the process 1700 looks up scaling parameters for geometry information with large feature width and space from the lookup table. In one embodiment, the geometry information with large feature width and space are the auxiliary patterns introduced in the periodic feature structure, as described with respect to FIGS. 15 and 16 above.

For each instance of geometry information with small feature width and space, the process 1700, at block 1740, extracts target near-field data by subtracting near-field data for edge-based components with large feature width and space (i.e., the auxiliary patterns) in the periodic feature structure generated for the instance of geometry information from the reference near-field data for the instance of geometry information as following:

$$K_T = K_R - K_A$$

where
- $K_T$ represents the target near-field data for the instance of geometry information with small feature width and space,
- $K_R$ represents the reference near-field rigorous simulation data collected for the periodic feature structure generated for the instance of geometry information, and
- $K_A$ represents the near-field data for edge-based components with large feature width and space (i.e., the auxiliary patterns) in the periodic feature structure generated for the instance of geometry information.

In one embodiment, the near-field data for edge-based components with large feature width and space (i.e., the auxiliary patterns) in the periodic feature structure are calculated based on the scaling parameters for the auxiliary patterns and the polarization and polarity matrix created in block 1710 above.

In one embodiment, for each instance of geometry information with small feature width and space, the process 1700, at block 1745, fits the target near-field data extracted in block 1740 above by scaling the polarization and polarity matrix using linear regression, and stores the obtained scaling parameters in the lookup table. For example and in one embodiment, linear regression is performed on the equations below to solve for scaling parameters p1 and p2 for an instance of geometry information with small feature width and space:

$$K_{even}(x_1) \times p_1 + K_{odd}(x_1) \times p_2 = K_T(x_1)$$

$$K_{even}(x_i) \times p_1 + K_{odd}(x_i) \times p_2 = K_T(x_i)$$

$$\ldots$$

$$K_{even}(x_n) \times p_1 + K_{odd}(x_n) \times p_2 = K_T(x_n)$$

where
- $K_{even}$ and $K_{odd}$ constitute the polarization and polarity matrix created in block 1710 described above,
- $K_T$ represents the target near-field data for the instance of geometry information with small feature width and space,
- $x_1 \ldots x_n$ are n discrete frequency components within optical bandwidth for the instance of geometry information.

One of ordinary skill in the art will recognize that the process 1700 is a conceptual representation of the operations used to build a lookup table that stores scaling parameters for edge coupling effect. The specific operations of the process 1700 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 1700 is performed by one or more software applications that execute on one or more computers.

In one embodiment, the lookup table with scaling parameters for various instances of geometry information is generated once and can be reused as long as the type of mask structure (e.g., the coating structure) is unchanged. The change to the mask patterns does not impact the usability of the lookup table. It takes a constant amount of time to look up the scaling parameters and apply them to the mask rasterization.

Figure 18:
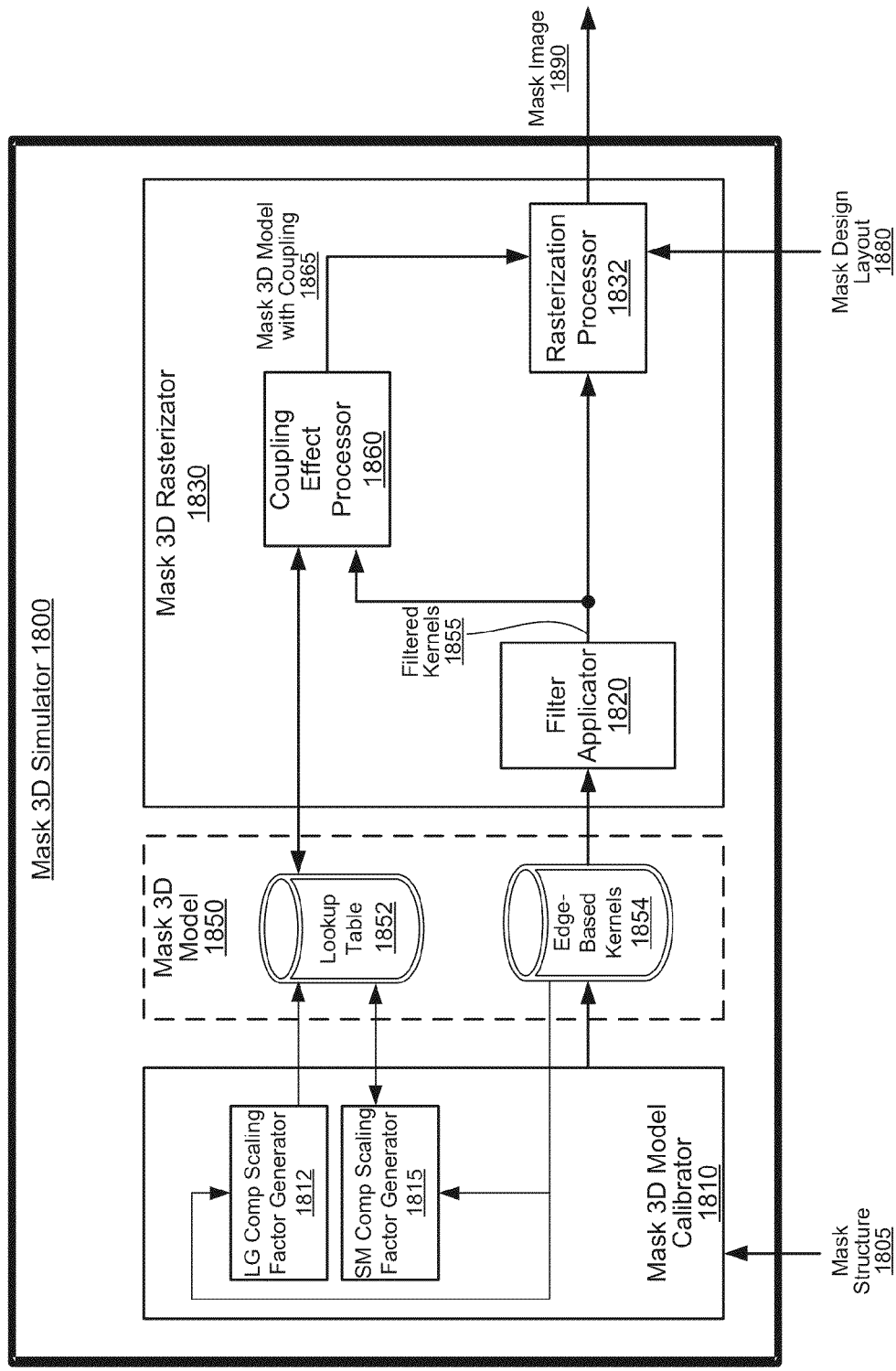
FIG. 18 conceptually illustrates one embodiment of a mask 3D simulator.

FIG. 18 conceptually illustrates one embodiment of a mask 3D simulator 1800. Specifically, this figure illustrates a set of components for performing the simulation of mask topography effect. In one embodiment, the mask 3D simulator 1800 is a stand-alone system implemented in a computer, while in another embodiment the mask 3D simulator 1800 is part of a system for performing electronic design automation (EDA) operations. As shown in FIG. 18, the mask 3D simulator 1800 includes a mask 3D model calibrator 1810 and a mask 3D rasterizator 1830. The mask 3D rasterizator 1830 includes a filter applicator 1820, a coupling effect processor 1860, and a rasterization processor 1832. In one embodiment, the mask rasterizator 1830 may be implemented in a processor, digital processing system (DSP), graphics processor or other computing element. The mask 3D model 1850 may be stored in memory.

The mask 3D model calibrator 1810 receives a mask topography structure 1805. Based on the mask topography structure 1805, the mask 3D model calibrator 1810 generates a mask 3D model 1850, which includes a lookup table 1852, edge-based kernels 1854, and a rasterization filter (not shown).

The lookup table 1852 stores scaling parameters for edge coupling effect. In one embodiment, the mask 3D model calibrator 1810 generates the lookup table 1852 through the process described in FIG. 13 or FIG. 17 above. The edge-based kernels 1854 can be applied to the edges in a mask design layout to produce mask 3D residual. In one embodiment, the mask 3D model calibrator 1810 generates the edge-based kernels 1854 through the process described in FIG. 3 above.

The mask 3D model calibrator 1810 includes a large component scaling factor generator 1812 and a small component scaling factor generator 1815. The large component scaling factor generator 1812 receives edge-based kernels 1854, generates scaling parameters for edge coupling effect on instances of geometry information whose sum of feature width and space is larger than or equal to the minimum pitch, and stores the generated scaling parameters in the lookup table 1852. In one embodiment, the operations performed by the large component scaling factor generator 1812 are described in blocks 1715-1725 of FIG. 17 above.

The small component scaling factor generator 1815 receives edge-based kernels 1854 and generates scaling parameters for edge coupling effect on instances of geometry information whose sum of feature width and space is smaller than the minimum pitch by using the scaling parameters generated by the large component scaling factor generator 1812. Those scaling parameters generated by the large component scaling factor generator 1812 are retrieved from the lookup table 1852. The small component scaling factor generator 1815 stores the generated scaling parameters in the lookup table 1852. In one embodiment, the operations performed by the small component scaling factor generator 1815 are described in blocks 1730-1745 of FIG. 17 above.

The rasterization filter can be applied to the edge-based kernels 1854 by filter applicator 1820 to improve the quality and efficiency of the edge-based kernels 1854. One embodiment of the rasterization filter is described in FIG. 8 above. The filter applicator 1820 receives the edge-based kernels 1854. The filter applicator 1820 applies the rasterization filter to the edge-based kernels 1854 and produces filtered kernels 1855.

The coupling effect processor 1860 receives the filtered kernels 1855 from the filter applicator 1820. The coupling effect processor 1860 retrieves scaling parameters from the lookup table 1852 and applies the scaling parameters to the filtered kernels 1855 to generate a mask 3D model with coupling effect 1865. In one embodiment, instead of receiving the filtered kernels 1855, the coupling effect processor 1860 receives the edge-based kernels 1854 and generates the mask 3D model with coupling effect 1865 based on the edge-based kernels 1854. The filter applicator 1820 then applies the rasterization filter to the mask 3D model with coupling effect 1865 to improve the quality and efficiency of the mask 3D model with coupling effect 1865.

The rasterization processor 1832 receives a mask design layout 1880. In one embodiment, the mask design layout 1880 is in the form of a polygon-based hierarchical data file in the GDS (Graphic Database System) or OASIS.MASK format. The all-angle processor 1832 deals with all-angle patterns in the mask design layout. The rasterization processor 1832 also receives the filtered kernels 1855 from the filter applicator 1820, and/or the mask 3D model with coupling effect 1865 from the coupling effect processor 1860. The rasterization processor 1832 rasterizes the mask design layout 1880 and produces a mask image 1890 as the output of the mask 3D simulator 1800.

The mask 3D simulator 1800 was described above for one embodiment of the invention. One of ordinary skill in the art will realize that in other embodiments this module can be implemented differently. For instance, in one embodiment described above, certain modules are implemented as software modules. However, in another embodiment, some or all of the modules of the mask 3D simulator 1800 might be implemented by hardware, which can be dedicated application specific hardware (e.g., an ASIC chip or component) or a general purpose chip (e.g., a microprocessor or FPGA).

This description and drawings are illustrative of embodiments of the invention and are not to be construed as limiting the invention. Numerous specific details are described to provide a thorough understanding of the disclosed embodiments. However, in certain instances, well known or conventional details are not described in order to avoid obscuring the description of the disclosed embodiments. References to "an" or "one" embodiment in the present disclosure are not necessarily to the same embodiment; such references mean at least one embodiment.

Many of the methods of the disclosed embodiments may be performed with a digital processing system, such as a conventional, general-purpose computer system. Special purpose computers, which are designed or programmed to perform only one function, may also be used.

Figure 19:
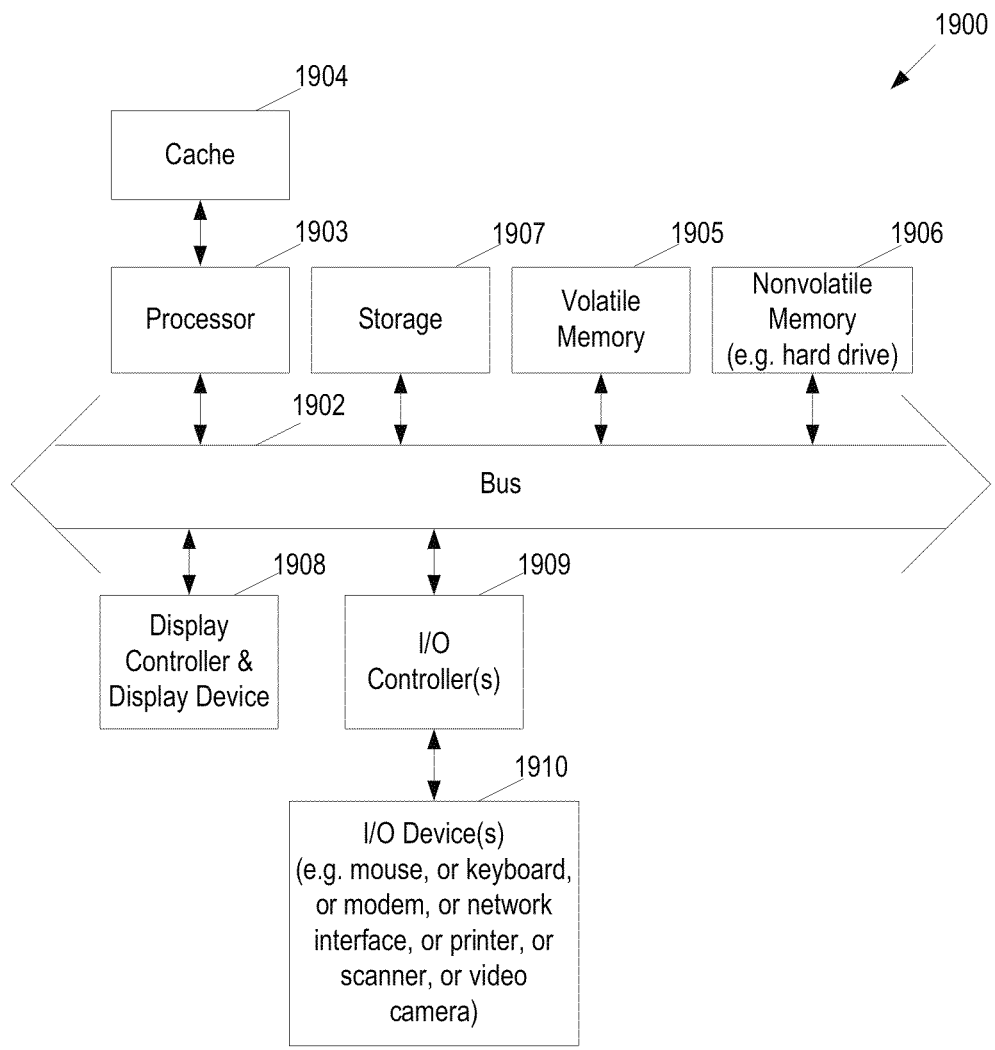
FIG. 19 shows one example of a typical computer system or data processing system that may be used with the disclosed embodiments.

FIG. 19 shows one example of a typical computer system or data processing system that may be used with the disclosed embodiments. For example, in one embodiment the processes described with respect to FIGS. 2-4, 12, 13, and 17 are operational through the example computing system. However, it is noted that while FIG. 19 illustrates various components of a computer system, it is not intended to represent any particular architecture or manner of interconnecting the components but rather provides an example representation of how the components and architecture may be configured. It will also be appreciated that network computers and other data processing systems that have fewer components or perhaps more components may also be used with the disclosed embodiments. The computer system of FIG. 19 may be any computing system capable of performing the described operations.

As shown in FIG. 19, the computer system 1900, which is a form of a data processing system, includes a bus 1902, which is coupled to one or more microprocessors 1903. In one embodiment, computer system 1900 includes one or more of a storage device (e.g., ROM) 1907, volatile memory (e.g., RAM) 1905, and a non-volatile memory (EEPROM, Flash) 1906. The microprocessor 1903 is coupled to cache memory 1904 as shown in the example of FIG. 19. Cache memory 1904 may be volatile or non-volatile memory.

The bus 1902 interconnects these various components together and in one embodiment interconnects these components 1903, 1907, 1905, and 1906 to a display controller and display device 1908. The computer system 1900 may further include peripheral devices such as input/output (I/O) devices, which may be mice, keyboards, modems, network interfaces, printers, scanners, video cameras and other devices which are well known in the art. Typically, the input/output devices 1910 are coupled to the system through input/output controllers 1909.

The volatile memory 1905 is typically implemented as dynamic RAM (DRAM) which requires power continually in order to refresh or maintain data in the memory. The non-volatile memory 1906 is typically a magnetic hard drive, magnetic optical drive, an optical drive, a DVD RAM, a Flash memory, or other type of memory system which maintains data even after power is removed from the system. Typically, the non-volatile memory will also be a random access memory although this is not required.

While FIG. 19 shows that the non-volatile memory is a local device coupled directly to the rest of the components in the data processing system, it will be appreciated that the disclosed embodiments may utilize a non-volatile memory which is remote from the system, such as a network storage device which is coupled to the data processing system through a network interface such as a modem or Ethernet interface.

The bus 1902 may include one or more buses connected to each other through various bridges, controllers and/or adapters as is well known in the art. In one embodiment the I/O controller 1909 includes a USB (Universal Serial Bus) adapter for controlling USB peripherals, and/or an IEEE-1394 bus adapter for controlling IEEE-1394 peripherals.

It will be apparent from this description that aspects of the disclosed embodiments may be embodied, at least in part, in software (or computer-readable instructions). That is, the techniques, for example the processes of FIGS. 2-4, 12, 13, and 17 may be carried out in a computer system or other data processing system in response to its processor, such as a microprocessor, executing sequences of instructions contained in a memory, such as storage device 1907, volatile memory 1905, non-volatile memory 1906, cache 1904 or a remote storage device. In various embodiments, hardwired circuitry may be used in combination with software instructions to implement the disclosed embodiments. Thus, the techniques are not limited to any specific combination of hardware circuitry and software or to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as microprocessor 1903.

A machine readable storage medium can be used to store software and data which when executed by a data processing system causes the system to perform various methods of the disclosed embodiments. This executable software and data may be stored in various places including, for example, storage device 1907, volatile memory 1905, non-volatile memory 1906 and/or cache 1904 as shown in FIG. 19. Portions of this software and/or data may be stored in any one of these storage devices.

Thus, a machine readable storage medium includes any mechanism that stores any information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

The detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The detailed description is, therefore, not to be taken in a limiting sense, and the scope of the present invention is defined by the appended claims.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some portions of the detailed description were presented as procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals of a computer readable storage medium and are capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "sending" or "receiving" or "displaying" or "calculating" or "determining" or "multiplying" or "computing" or "identifying" or the like, refer to the action and processes of a computer system, or similar electronic computing device that manipulates and transforms data represented as physical (electronic) quantities within the computer system's registers and memories and other computer readable media into other data similarly represented as physical quantities within the computer system's memories or registers or other such information storage, transmission or display devices.

In the foregoing specification, the disclosed embodiments have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A method of performing mask topography effect modeling on a mask design layout for integrated circuit design, the method comprising, upon receiving the mask design layout:
    generating scaling parameters for edge coupling effects, each scaling parameter having an associated combination of feature width and space, wherein a sum of feature width and space associated with at least one scaling parameter is less than a minimum pitch; and using a computing device, applying a thick mask model comprising a plurality of edge-based kernels to the mask design layout to create a mask 3D residual, comprising updating the plurality of edge-based kernels with the scaling parameters.

2. The method of claim 1, wherein the applying of the thick mask model further comprises:

applying a rasterization filter to the plurality of edge-based kernels to generate a plurality of filtered kernels; and applying the plurality of filtered kernels to edges in the mask design layout to create the 3D mask residual.

3. The method of claim 2, wherein generating the scaling parameters comprises:

generating a first plurality of periodic structures, for simulation;

collecting near-field data for the first plurality of periodic structures through rigorous simulation, each of the first plurality of periodic structures associated with a combination of feature width and space, wherein a sum of the feature width and the space is greater than or equal to the minimum pitch;

for each of the first plurality of periodic structures, calculating a set of first scaling parameters by performing linear regression based on the plurality of filtered kernels and the near-field data related to the periodic structure; and storing the calculated first scaling parameters in a lookup table, each first scaling parameter indexed by a combination of feature width and space of a corresponding periodic structure.

4. The method of claim 3, wherein generating the scaling parameters further comprises:

collecting reference near-field data for a second plurality of periodic structures through rigorous simulation, each of the second plurality of periodic structures comprises a first set of components whose sum of feature width and space is less than the minimum pitch and a second set of components whose sum of feature width and space is greater than or equal to the minimum pitch;

extracting near-field data for the first set of components by subtracting near-field data for the second set of components from the reference near-field data;

for each of the second plurality of periodic structures, calculating a set of second scaling parameters by performing linear regression based on the plurality of filtered kernels and the near-field data for the first set of components of the periodic structure; and storing the calculated second scaling parameters in the lookup table, each second scaling parameter indexed by a combination of feature width and space of the first set of components of a corresponding periodic structure.

5. The method of claim 4, wherein the set of scaling parameters includes scaling factors for TE polarization and TM polarization.

6. The method of claim 1, wherein the updating of the plurality of edge-based kernels comprises:

determining edge segments and adjacent feature width and space for each edge segment;

for each edge segment, determining a set of scaling parameters corresponding to the feature width and space combination for the edge segment;

for each edge segment, updating the plurality of edge-based kernels by applying the set of scaling parameters determined for the edge segment; and for each edge segment, applying the plurality of updated kernels to reflect edge coupling effect.

7. The method of claim 6, wherein the determining of the adjacent feature width and space for each edge segment comprises performing a vertical scan and a horizontal scan using a scanline algorithm.

8. The method of claim 1 further comprising:

applying a thin mask model to the mask design layout to create a thin mask transmission; and combining the thin mask transmission and the mask 3D residual to create a mask 3D transmission.

9. The method of claim 1 further comprising generating the thick mask model.

10. The method of claim 9, wherein the generating of the thick mask model comprises:

receiving a mask topography structure;

performing a rigorous simulation to simulate a near-field;

generating a reference mask 3D residual by subtracting a thin mask electric field from the near-field; and deriving the plurality of edge-based kernels by decomposing the reference mask 3D residual.

11. The method of claim 10 further comprising obtaining the thin mask electric field through a rasterization with foreground and background transmission.

12. A data processing system for performing mask topography effect modeling on a mask design layout, the data processing system comprising:

a calibrator that is to generate scaling parameters for edge coupling effects, each scaling parameter having an associated combination of feature width and space, wherein a sum of feature width and space associated with at least one scaling parameter is smaller than a minimum pitch;

a coupling effect processor that is to update a plurality of edge-based kernels with the scaling parameters; and a rasterization processor that is to apply a thick mask model comprising the updated edge-based kernels to the mask design layout to create a mask 3D residual.

13. The data processing system of claim 12, wherein the plurality of edge-based kernels is generated by the calibrator.

14. The data processing system of claim 12, wherein the calibrator comprises:

a large component scaling factor generator that is to generate a first set of scaling parameters for large edge-based components, wherein a sum of feature width and space for each large edge-based component is larger than or equal to the minimum pitch; and a small component scaling factor generator that is to generate a second set of scaling parameters for small edge-based components, wherein a sum of feature width and space for each small edge-based component is smaller than the minimum pitch.

15. The data processing system of claim 14, wherein the small component scaling factor generator generates the second set of scaling parameters by using the first set of scaling parameters.

16. The data processing system of claim 12, wherein the scaling parameters includes scaling factors for transverse electric (TE) polarization and transverse magnetic (TM) polarization.

17. The data processing system of claim 12 further comprising a filter applicator that is to apply a rasterization filter to the plurality of edge-based kernels.

18. A computer program product stored as program code on a non-transitory computer-readable medium, the program code executable by at least one processor for performing mask topography effect modeling on a mask design layout, the computer program product comprising a computer readable program code comprising instructions for:

generating scaling parameters for edge coupling effects, each scaling parameter having an associated combination of feature width and space, wherein a sum of feature width and space associated with at least one scaling parameter is less than a minimum pitch; and using a computing device, applying a thick mask model comprising a plurality of edge-based kernels to the mask design layout to create a mask 3D residual, comprising updating the plurality of edge-based kernels with the scaling parameters.

19. The computer program product of claim 18, wherein the instructions for generating the scaling parameters comprise instructions for:

collecting near-field data for a first plurality of periodic structures through rigorous simulation, each of the first plurality of periodic structures associated with a combination of feature width and space, wherein a sum of the feature width and the space is greater than or equal to the minimum pitch;

for each of the first plurality of periodic structures, calculating a set of first scaling parameters by performing linear regression based on the plurality of filtered kernels and the near-field data related to the periodic structure; and storing the calculated first scaling parameters into a lookup table, each first scaling parameter indexed by a combination of feature width and space of a corresponding periodic structure.

20. The computer program product of claim 19, wherein the instructions for generating the scaling parameters further comprise instructions for:

collecting reference near-field data for a second plurality of periodic structures through rigorous simulation, each of the second plurality of periodic structures comprises a first set of components whose sum of feature width and space is less than the minimum pitch and a second set of components whose sum of feature width and space is greater than or equal to the minimum pitch;

extracting near-field data for the first set of components by subtracting near-field data for the second set of components from the reference near-field data;

for each of the second plurality of periodic structures, calculating a set of second scaling parameters by performing linear regression based on the plurality of filtered kernels and the near-field data for the first set of components of the periodic structure; and storing the calculated second scaling parameters into the lookup table, each second scaling parameter indexed by a combination of feature width and space of the first set of components of a corresponding periodic structure.

* * * * *